United States Patent
Matsui et al.

(10) Patent No.: US 7,907,648 B2
(45) Date of Patent: Mar. 15, 2011

(54) OPTICAL FM SOURCE BASED ON INTRA-CAVITY PHASE AND AMPLITUDE MODULATION IN LASERS

(75) Inventors: Yasuhiro Matsui, Woburn, MA (US); Kevin J. McCallion, Charlestown, MA (US); Parviz Tayebati, Boston, MA (US)

(73) Assignee: Finisar Corporation, Sunnyvale, CA (US)

( * ) Notice: Subject to any disclaimer, the term of this patent is extended or adjusted under 35 U.S.C. 154(b) by 235 days.

(21) Appl. No.: 12/115,337

(22) Filed: May 5, 2008

(65) Prior Publication Data

US 2008/0240180 A1    Oct. 2, 2008

Related U.S. Application Data

(63) Continuation-in-part of application No. 11/272,100, filed on Nov. 8, 2005, now Pat. No. 7,477,851, and a continuation-in-part of application No. 10/308,522, filed on Dec. 3, 2002, now Pat. No. 7,663,762, and a continuation-in-part of application No. 11/441,944, filed on May 26, 2006, now Pat. No. 7,492,976, and a continuation-in-part of application No. 11/037,718, filed on Jan. 18, 2005, now Pat. No. 7,536,113, and a continuation-in-part of application No. 11/068,032, filed on Feb. 28, 2005, now Pat. No. 7,555,225, and a continuation-in-part of application No. 11/084,630, filed on Mar. 18, 2005, now Pat. No. 7,406,266, and a continuation-in-part of application No. 11/787,163, filed on Apr. 13, 2007, now Pat. No. 7,613,401, and a continuation-in-part of application No. 12/047,017, filed on Mar. 12, 2008.

(60) Provisional application No. 60/927,727, filed on May 4, 2007.

(51) Int. Cl.
*H01S 3/10* (2006.01)

(52) U.S. Cl. .......... 372/26; 372/43.01; 372/96; 372/102
(58) Field of Classification Search .................. 372/26, 372/28, 29.01–29.016, 32, 43.01, 50.1–50.11, 372/96, 97, 102
See application file for complete search history.

(56) References Cited

U.S. PATENT DOCUMENTS 3,324,295 A    6/1967  Harris
(Continued)

FOREIGN PATENT DOCUMENTS

GB    2 107 147    4/1983
(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner* — Minsun Harvey
*Assistant Examiner* — Xnning Niu
(74) *Attorney, Agent, or Firm* — Workman Nydegger

(57) ABSTRACT

A laser is disclosed including a gain section having a distributed feedback grating imposed thereon. An absorption section is embedded in the gain section such that the first and second portions of the distributed feedback grating extend on either side of the electro-absorption section. A controller imposes a substantially DC bias signal on the first and second gain electrodes and imposes a modulation signal encoding digital data on the modulation electrode to generate a frequency modulated signal. In some embodiments, the first and second portions are biased above the lasing threshold and the absorption section is modulated below the lasing threshold to modulate loss in the absorption section.

19 Claims, 24 Drawing Sheets

U.S. PATENT DOCUMENTS

| | | | |
|---|---|---|---|
| 3,999,105 | A | 12/1976 | Archey et al. |
| 4,038,600 | A | 7/1977 | Thomas et al. |
| 4,561,119 | A | 12/1985 | Epworth |
| 4,805,235 | A | 2/1989 | Henmi |
| 4,841,519 | A | 6/1989 | Nishio |
| 4,908,833 | A * | 3/1990 | Chraplyvy et al. ............ 372/96 |
| 5,170,402 | A * | 12/1992 | Ogita et al. ..................... 372/20 |
| 5,293,545 | A | 3/1994 | Huber |
| 5,325,378 | A | 6/1994 | Zorabedian |
| 5,371,625 | A | 12/1994 | Wedding et al. |
| 5,394,429 | A * | 2/1995 | Yamada et al. ................ 372/96 |
| 5,412,474 | A | 5/1995 | Reasenberg et al. |
| 5,416,629 | A | 5/1995 | Huber |
| 5,465,264 | A | 11/1995 | Buhler et al. |
| 5,477,368 | A | 12/1995 | Eskildsen et al. |
| 5,550,667 | A | 8/1996 | Krimmel et al. |
| 5,592,327 | A | 1/1997 | Gabl et al. |
| 5,642,371 | A * | 6/1997 | Tohyama et al. .......... 372/45.01 |
| 5,737,104 | A | 4/1998 | Lee et al. |
| 5,777,773 | A | 7/1998 | Epworth et al. |
| 5,805,235 | A | 9/1998 | Bedard |
| 5,856,980 | A | 1/1999 | Doyle et al. |
| 5,920,416 | A | 7/1999 | Beylat et al. |
| 5,953,139 | A | 9/1999 | Nemecek et al. |
| 5,974,209 | A | 10/1999 | Cho et al. |
| 6,081,361 | A | 6/2000 | Adams et al. |
| 6,091,743 | A * | 7/2000 | Yang ................................. 372/6 |
| 6,096,496 | A | 8/2000 | Frankel |
| 6,104,851 | A | 8/2000 | Mahgerefteh |
| 6,115,403 | A | 9/2000 | Brenner et al. |
| 6,148,017 | A * | 11/2000 | Borchert et al. ............. 372/50.1 |
| 6,222,861 | B1 | 4/2001 | Kuo et al. |
| 6,271,959 | B1 | 8/2001 | Kim et al. |
| 6,298,186 | B1 | 10/2001 | He |
| 6,331,991 | B1 | 12/2001 | Mahgerefteh |
| 6,359,716 | B1 | 3/2002 | Taylor |
| 6,473,214 | B1 | 10/2002 | Roberts et al. |
| 6,506,342 | B1 | 1/2003 | Frankel |
| 6,563,623 | B1 | 5/2003 | Penninckx et al. |
| 6,577,013 | B1 | 6/2003 | Glenn et al. |
| 6,618,513 | B2 | 9/2003 | Evankow, Jr. |
| 6,654,564 | B1 | 11/2003 | Colbourne et al. |
| 6,665,351 | B2 | 12/2003 | Hedberg et al. |
| 6,687,278 | B1 | 2/2004 | Mason et al. |
| 6,748,133 | B2 | 6/2004 | Liu et al. |
| 6,778,307 | B2 | 8/2004 | Clark |
| 6,810,047 | B2 | 10/2004 | Oh et al. |
| 6,834,134 | B2 | 12/2004 | Brennan et al. |
| 6,836,487 | B1 | 12/2004 | Farmer et al. |
| 6,847,758 | B1 | 1/2005 | Watanabe |
| 6,947,206 | B2 | 9/2005 | Tsadka et al. |
| 6,963,685 | B2 | 11/2005 | Mahgerefteh et al. |
| 7,013,090 | B2 | 3/2006 | Adachi et al. |
| 7,054,538 | B2 | 5/2006 | Mahgerefteh et al. |
| 7,076,170 | B2 | 7/2006 | Choa |
| 7,123,846 | B2 | 10/2006 | Tateyama et al. |
| 7,263,291 | B2 | 8/2007 | Mahgerefteh et al. |
| 7,280,721 | B2 | 10/2007 | McCallion et al. |
| 2002/0154372 | A1 | 10/2002 | Chung et al. |
| 2002/0159490 | A1 | 10/2002 | Karwacki |
| 2002/0176659 | A1 | 11/2002 | Lei et al. |
| 2003/0002120 | A1 | 1/2003 | Choa |
| 2003/0067952 | A1 | 4/2003 | Tsukiji et al. |
| 2003/0099018 | A1 | 5/2003 | Singh et al. |
| 2003/0147114 | A1 | 8/2003 | Kang et al. |
| 2003/0193974 | A1 | 10/2003 | Frankel et al. |
| 2004/0008933 | A1 | 1/2004 | Mahgerefteh et al. |
| 2004/0008937 | A1 | 1/2004 | Mahgerefteh et al. |
| 2004/0036943 | A1 | 2/2004 | Freund et al. |
| 2004/0076199 | A1 | 4/2004 | Wipiejewski et al. |
| 2004/0096221 | A1 | 5/2004 | Mahgerefteh et al. |
| 2004/0218890 | A1 | 11/2004 | Mahgerefteh et al. |
| 2005/0100345 | A1 | 5/2005 | Welch et al. |
| 2005/0111852 | A1 | 5/2005 | Mahgerefteh et al. |
| 2005/0175356 | A1 | 8/2005 | McCallion et al. |
| 2005/0206989 | A1 | 9/2005 | Marsh |
| 2005/0271394 | A1 | 12/2005 | Whiteaway et al. |
| 2005/0286829 | A1 | 12/2005 | Mahgerefteh et al. |
| 2006/0002718 | A1 | 1/2006 | Matsui et al. |
| 2006/0018666 | A1 | 1/2006 | Matsui et al. |
| 2006/0029358 | A1 | 2/2006 | Mahgerefteh et al. |
| 2006/0029396 | A1 | 2/2006 | Mahgerefteh et al. |
| 2006/0029397 | A1 | 2/2006 | Mahgerefteh et al. |
| 2006/0228120 | A9 | 10/2006 | McCallion et al. |
| 2006/0233556 | A1 | 10/2006 | Mahgerefteh et al. |
| 2006/0274993 | A1 | 12/2006 | Mahgerefteh et al. |

FOREIGN PATENT DOCUMENTS

| | | |
|---|---|---|
| WO | 9905804 | 2/1999 |
| WO | 0104999 | 1/2001 |
| WO | 03005512 | 1/2003 |

OTHER PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Hyryniewicz, J.V., et al., Higher Order Filter Response in Coupled Microring Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutall et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3- μm InGaAlAs Multiquantum Well Ridge Waveguide Distributed Feedback Lasers, IEEE Photonics Technology Leters, Oct. 1, 2007, pp. 1436-1438, vol. 19 No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

* cited by examiner $$\frac{\partial N}{\partial t} = \frac{I_{bias}}{e \cdot vol} - \frac{g}{1+\varepsilon S} S - BN^2 \quad \text{--- Carriers}$$

$$\frac{\partial S}{\partial t} = \Gamma \frac{g}{1+\varepsilon S} S - \frac{S}{\tau_p} \quad \text{--- Photons}$$

$$\frac{\partial \Phi}{\partial t} = \frac{1}{2} \Gamma \frac{dn}{dN} (N - N_{ref}) + PM \quad \text{--- Phase}$$

FIG. 4

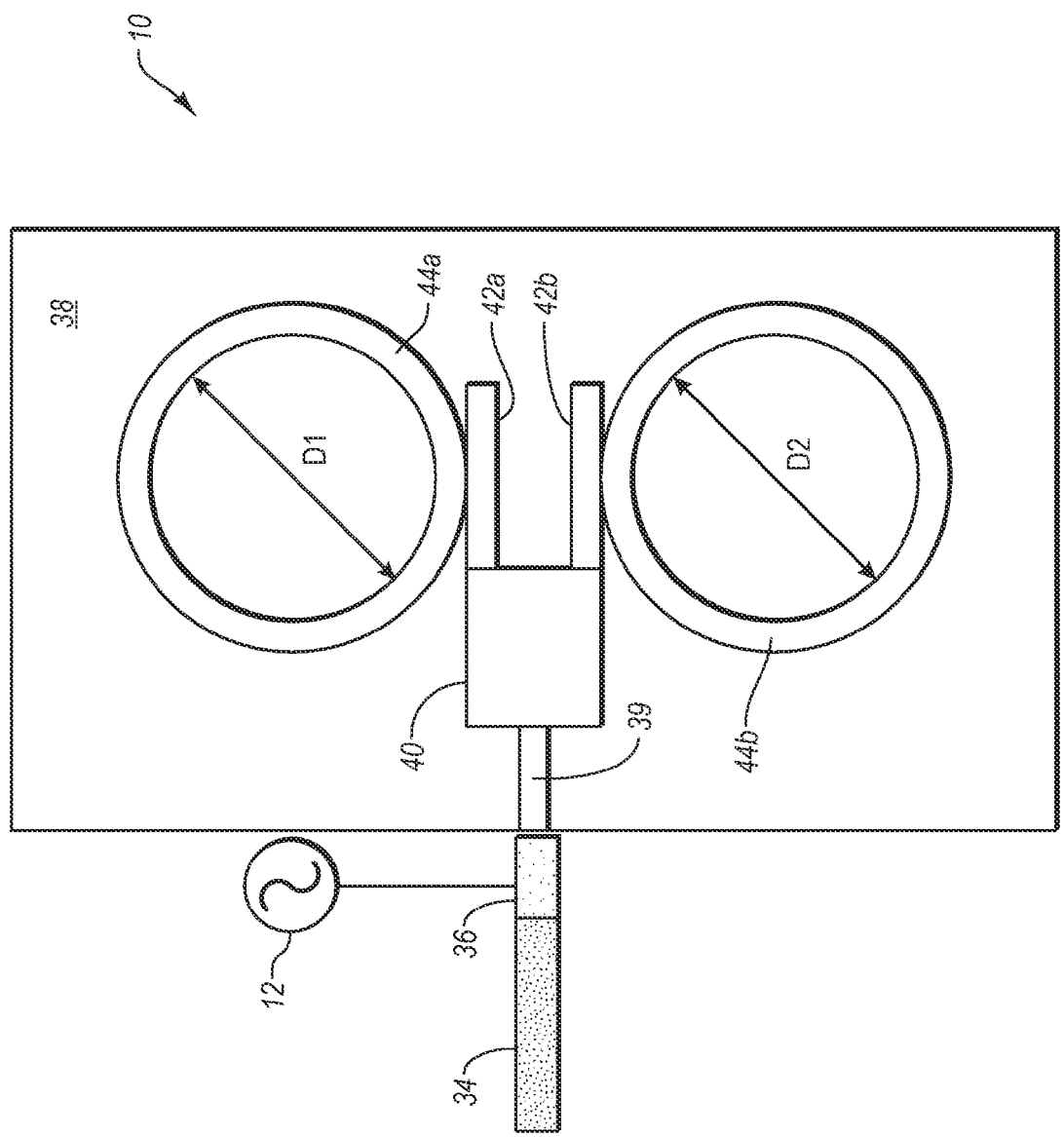

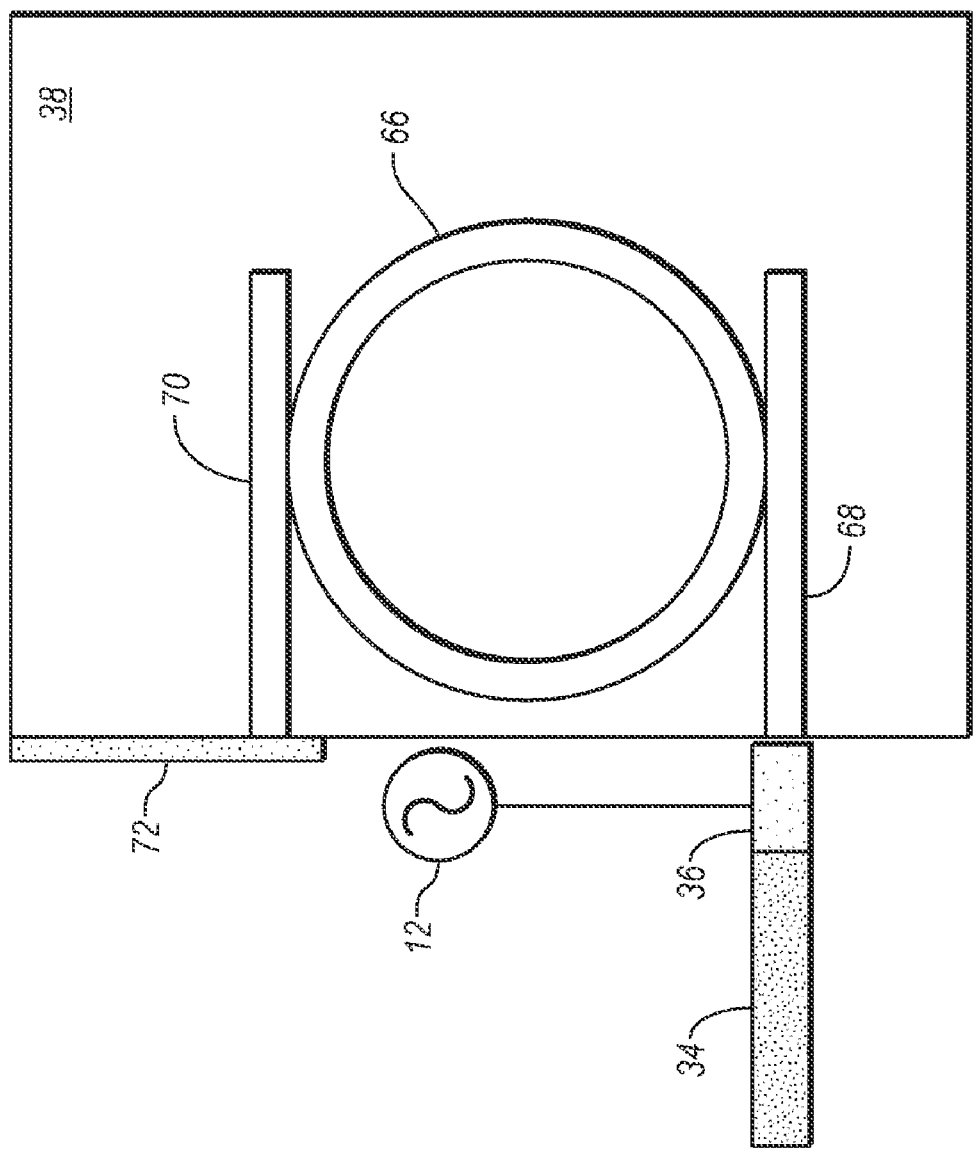

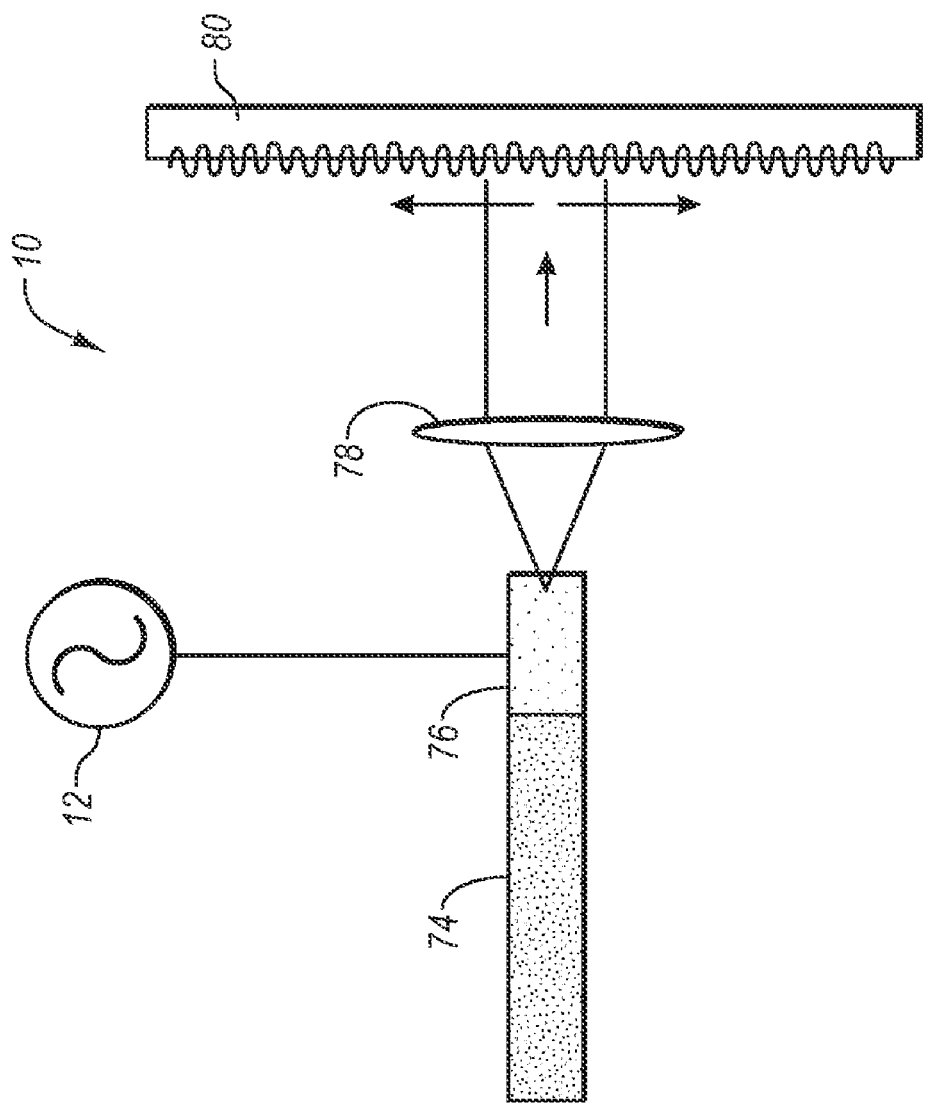

OPTICAL FM SOURCE BASED ON INTRA-CAVITY PHASE AND AMPLITUDE MODULATION IN LASERS

CROSS-REFERENCE TO RELATED APPLICATIONS

This patent application:

(i) is a continuation-in-part of pending prior U.S. patent application Ser. No. 11/272,100, filed Nov. 8, 2005 by Daniel Mahgerefteh et al. for POWER SOURCE FOR A DISPERSION COMPENSATION FIBER OPTIC SYSTEM;

(ii) is a continuation-in-part of pending prior U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR;

(iii) is a continuation-in-part of pending prior U.S. patent application Ser. No. 11/441,944, filed May 26, 2006 by Daniel Mahgerefteh et al. for FLAT DISPERSION FREQUENCY DISCRIMINATOR (FDFD);

(iv) is a continuation-in-part of pending prior U.S. patent application Ser. No. 11/037,718, filed Jan. 18, 2005 by Yasuhiro Matsui et al. for CHIRP MANAGED DIRECTLY MODULATED LASER WITH BANDWIDTH LIMITING OPTICAL SPECTRUM RESHAPER;

(v) is a continuation-in-part of pending prior U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT;

(vi) is a continuation-in-part of pending prior U.S. patent application Ser. No. 11/084,630, filed Mar. 18, 2005 by Daniel Mahgerefteh et al. for FLAT-TOPPED CHIRP INDUCED BY OPTICAL FILTER EDGE;

(vii) is a continuation-in-part of pending prior U.S. patent application Ser. No. 11/787,163, filed Apr. 13, 2007 by Yasuhiro Matsui et al. for OPTICAL FM SOURCE BASED ON INTRA-CAVITY PHASE AND AMPLITUDE MODULATION IN LASERS;

(viii) is a continuation-in-part of pending prior U.S. patent application Ser. No. 12/047,017, filed Mar. 12, 2008 by Yasuhiro Matsui et al. for OPTICAL FM SOURCE BASED ON INTRA-CAVITY PHASE AND AMPLITUDE MODULATION IN LASERS (ix) claims the benefit of pending prior U.S. Provisional Patent Application Ser. No. 60/927,727, filed May 4, 2007 by Yasuhiro Matsui et al. for OPTICAL FM SOURCE TUNABLE TRANSMITTER FOR OPTICAL COMMUNICATION SYSTEMS.

The nine (9) above-identified patent applications are hereby incorporated herein by reference.

BACKGROUND OF THE INVENTION

1. The Field of the Invention

This invention generally relates to semiconductor laser diodes used in optical fiber communication systems, and more particularly to the frequency modulation of such laser diodes for coding data being transmitted within such fiber optic communication systems, including chirp-managed directly modulated lasers.

2. The Relevant Technology

Optical communication systems based on frequency shift keying require lasers that can generate optical frequency modulation (FM) with high efficiency and a flat response from low frequencies up to the frequency comparable to the bit rate of the transmission systems, e.g., 1 MHz to 10 GHz for a 10 Gb/s digital signal.

Direct gain modulation of a semiconductor laser is a known, simple scheme to generate FM. It generally comprises the steps of biasing the laser with a DC bias so as to provide gain to the laser, and modulating this injected current about the DC bias so as to generate the desired FM. However, this method of FM generation is very inefficient. More particularly, a measure of FM efficiency is the ratio of the peak-peak frequency modulation (also sometimes referred to as adiabatic chirp) generated to the applied modulation current or the applied modulation voltage (as the case may be). For example, for a directly modulated laser in which the laser impedance is matched to 50 Ohms, the FM efficiency is typically about 3 GHz/V. Direct gain modulation generates frequency modulation (adiabatic chirp) through the physical mechanism sometimes called gain compression, spatial hole burning, and linewidth enhancement, which generates an index change for any associated gain change in the material. All of these processes are known in the art. Furthermore, FM modulation by gain modulation through current injection leads to the heating of laser cavity, which in turn causes the lasing frequency to red shift to lower frequencies on a slow time scale. This effect is sometimes called thermal chirp and typically has a frequency response of <20 MHz associated with the thermal diffusion and dissipation time constants. Thermal chirp, which is red shifted for an increase in drive signal, counteracts the desired adiabatic chirp, which generates a blue shift for the same signal. Thermal chirp can generate pattern dependence and can increase the bit error rate (BER) of a digital transmission system such as a chirp managed laser (CML) transmitter.

The quality and performance of a digital fiber optic transmitter is determined by the distance over which the transmitted digital signal can propagate without severe distortions. The bit error rate (BER) of the signal is measured at a receiver after propagation through dispersive fiber, and the optical power required to obtain a certain BER (typically $10^{-12}$), which is sometimes called the sensitivity, is determined. The difference in sensitivity at the output of the transmitter vis-á-vis the sensitivity after propagation is sometimes called the dispersion penalty. This is typically characterized by the distance over which a dispersion penalty reaches a level of about 1 dB. A standard 10 Gb/s optical digital transmitter, such as an externally modulated source, can transmit up to a distance of about 50 km in standard single mode fiber at 1550 nm before the dispersion penalty reaches a level of about 1 dB, which is sometimes called the dispersion limit. The dispersion limit is determined by the fundamental assumption that the digital signal is transform-limited, i.e., the signal has no time-varying phase across its bits and has a bit period of 100 ps, or 1/(bit rate), for the standard 10 Gb/s transmission. Another measure of the quality of a transmitter is the absolute sensitivity after fiber propagation.

Three types of optical transmitters are presently in use in prior art fiber optic systems: (i) directly modulated lasers (DML); (ii) Electroabsorption Modulated Lasers (EML); and (iii) Externally Modulated Mach Zhender modulators (MZ). For transmission in standard single mode fiber at 10 Gb/s, and 1550 nm, it has generally been assumed that MZ modulators and EMLs can have the longest reach, typically reaching approximately 80 km. Using a special coding scheme, sometimes referred to as the phase-shaped duobinary approach, MZ transmitters can reach approximately 200 km. On the other hand, directly modulated lasers (DML) typically reach <5 km because their inherent time-dependent chirp causes severe distortion of the signal after this distance.

Recently, various systems have been developed which provide long-reach lightwave data transmission (e.g., >80 km at 10 Gb/s) using DMLs. By way of example but not limitation, systems which increase the reach of DMLs to >80 km at 10 Gb/s in single mode fiber are disclosed in (i) U.S. patent application Ser. No. 11/272,100, filed Nov. 8, 2005 by Daniel Mahgerefteh et al. for POWER SOURCE FOR A DISPERSION COMPENSATION FIBER OPTIC SYSTEM; (ii) U.S. patent application Ser. No. 11/441,944, filed May 26, 2006 by Daniel Mahgerefteh et al. for FLAT DISPERSION FREQUENCY DISCRIMINATOR (FDFD); and (iii) U.S. patent application Ser. No. 10/308,522, filed Dec. 3, 2002 by Daniel Mahgerefteh et al. for HIGH-SPEED TRANSMISSION SYSTEM COMPRISING A COUPLED MULTI-CAVITY OPTICAL DISCRIMINATOR; which patent applications are hereby incorporated herein by reference. The transmitters associated with these novel systems are sometimes referred to as Chirp Managed Laser (CML™) transmitters by Azna LLC of Wilmington, Mass. In these new CML systems, a Frequency Modulated (FM) source is followed by an Optical Spectrum Reshaper (OSR) which uses the frequency modulation to increase the amplitude modulated signal and partially compensate for dispersion in the transmission fiber. See FIG. 1, which shows a CML transmitter. In some preferred embodiments of these CML transmitters, the frequency modulated source may comprise a Directly Modulated Laser (DML). The Optical Spectrum Reshaper (OSR), sometimes referred to as a frequency discriminator, can be formed by an appropriate optical element that has a wavelength-dependent transmission function, e.g., a filter. The OSR can be adapted to convert frequency modulation to amplitude modulation.

The present invention is intended to enhance the performance of the aforementioned CML systems, among other things.

BRIEF SUMMARY OF THE INVENTION

In one aspect of the invention a laser comprises a gain section having a distributed feedback grating imposed thereon. An electro-absorption section is embedded in the gain section such that the first and second portions of the distributed feedback grating extend on either side of the electro-absorption section. First and second gain electrodes are positioned over the first and second portions of the distributed feedback section and a modulation electrode is positioned over the electro-absorption section. of the gain section on opposite sides of the electro-absorption section. A controller in electrical communication with the first and second gain electrodes and the modulation electrode is programmed to impose a substantially DC signal on the first and second gain electrodes and to impose a modulation signal encoding digital data on the modulation electrode.

In another aspect of the invention, the electro-absorption section has a length less than ten percent, preferably less than six percent, that of the gain section.

In another aspect of the invention, a distributed feedback section of a laser has first and second gain electrodes positioned thereon and a modulation electrode positioned between the first and second gain electrodes. The first and second gain electrodes are biased above the lasing threshold and the modulation electrode is modulated below the lasing threshold to modulate loss in the section of the distributed feedback section beneath the modulation electrode.

BRIEF DESCRIPTION OF THE DRAWINGS

These and other objects, features and advantages of the present invention will be more fully disclosed or rendered obvious by the following detailed description of the preferred embodiments of the invention, which is to be considered together with the accompanying drawings wherein like numbers refer to like parts and further wherein:

FIG. 4 shows rate equations for a laser, including loss modulation by modulation of photon lifetime;

FIG. 14A illustrates a phase modulated external cavity laser having a parallel resonator rings;

FIG. 14D illustrates a phase modulated external cavity laser having a single resonator ring;

FIG. 15 illustrates a phase modulated external cavity laser having a grating waveguide structure;

DETAILED DESCRIPTION OF THE PREFERRED EMBODIMENTS

Figure 2:
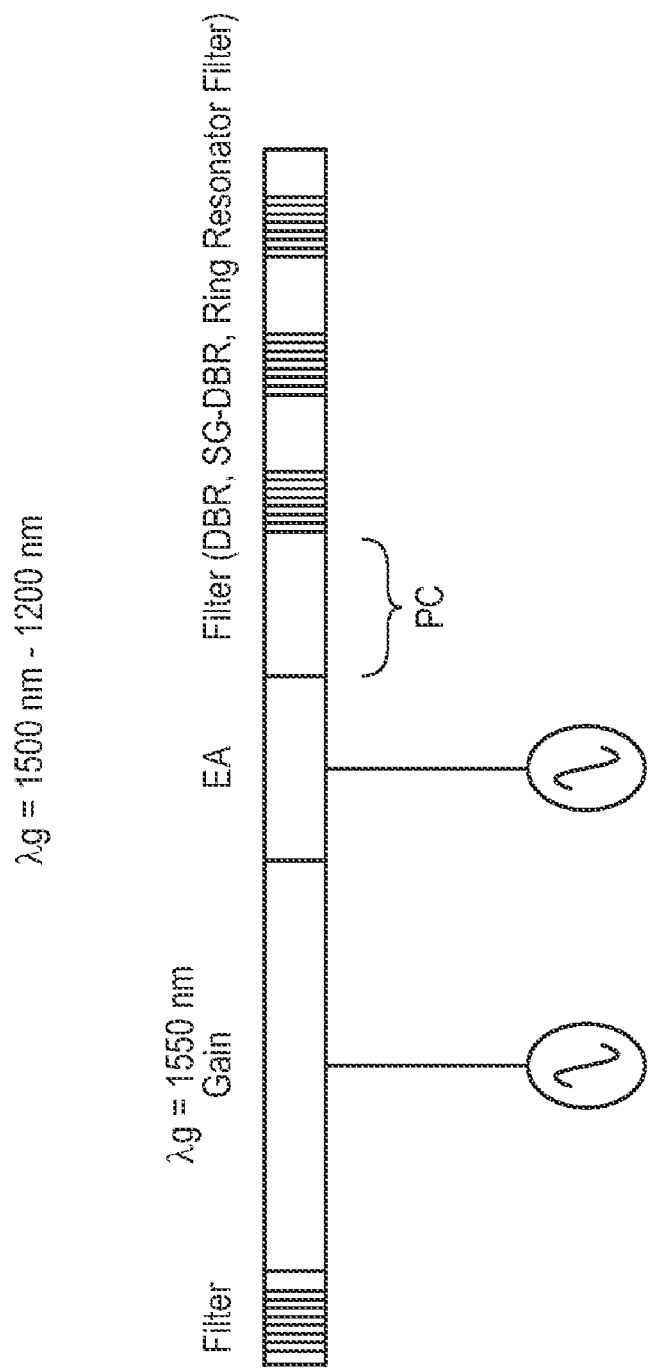
FIG. 2 is a schematic diagram showing a DBR laser having a directly modulated electro-absorption loss section in the cavity for efficient FM generation.

FIG. 2 shows one preferred embodiment of the present invention, wherein an electro-absorption (EA) modulator is integrated inside a distributed Bragg reflector (DBR) laser cavity. The EA section is reverse biased. Application of a reverse bias voltage to the EA increases cavity loss, which increases the threshold gain for lasing. This increases the threshold carrier density, which causes the laser frequency to shift towards the blue, i.e., so as to provide frequency modulation.

Figure 3:
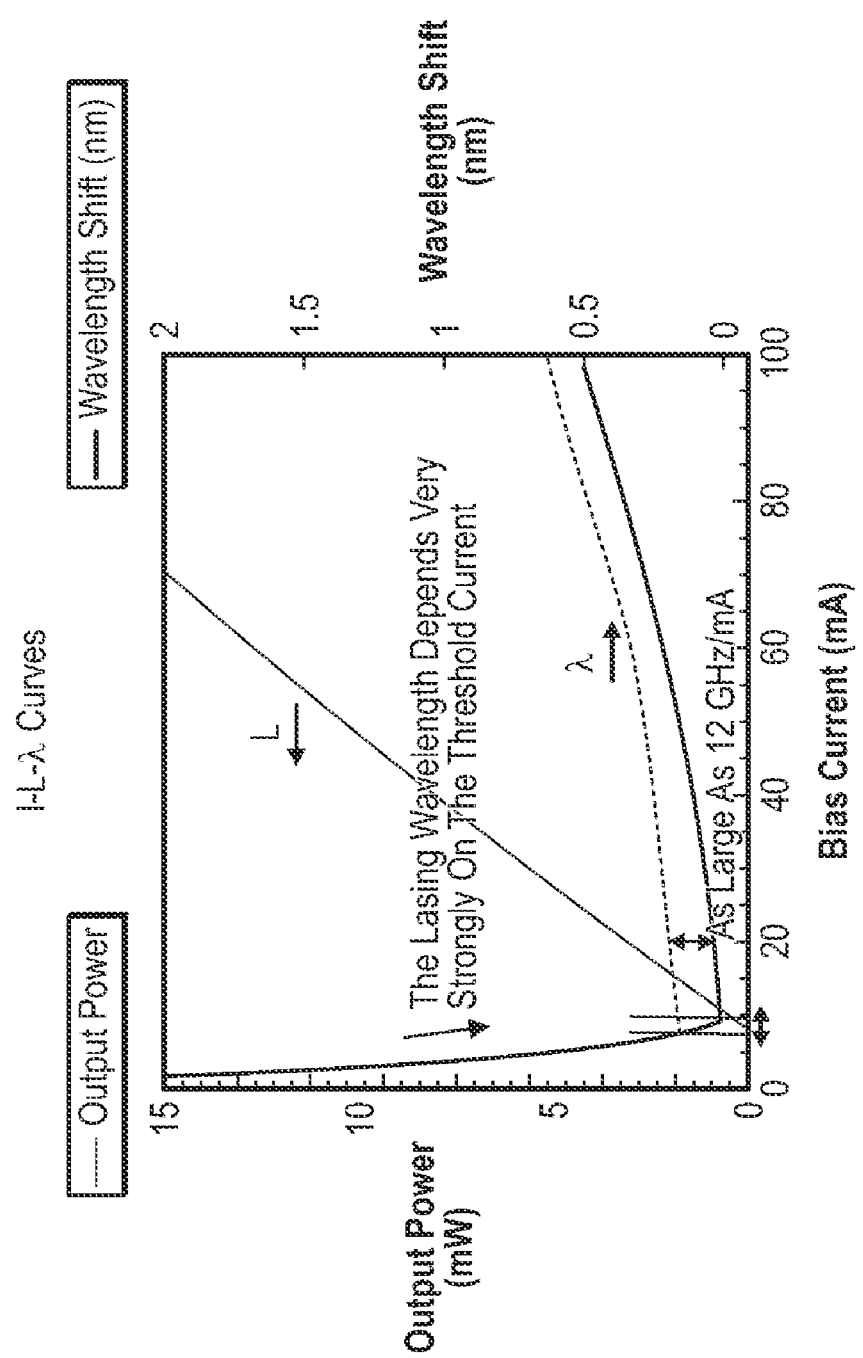
FIG. 3 shows the dependence of the lasing wavelength on threshold current and demonstrates the efficiency of using loss modulation in the laser for FM generation.

The large FM efficiency by loss modulation can be understood by considering FIG. 3, which shows the lasing wavelength as a function of injection current into a constant wave (CW) laser. It is known that the lasing wavelength of a CW semiconductor laser depends on the threshold current. Wavelength shifts to the blue as more carriers are injected into the laser below threshold. For example, the wavelength of the laser shifts by 0.2 nm (24 GHz) when the threshold current increases from 7 mA to 9 mA. This corresponds to a frequency shift efficiency of 12 GHz/mA, and indicates that intra-cavity loss modulation can be a very efficient way to generate FM in a laser.

A modification of the "standard rate equations model" for a semiconductor laser can demonstrate how loss modulation generates FM in the case of high speed modulation. FIG. 4 shows the set of rate equations for photons, carriers and phase, in which loss modulation is included by modulating the photon lifetime in the rate equation. Modulation of photon lifetime can be achieved by modulating the mirror loss of the cavity. Modulation of photon lifetime is one of several methods for modulating the intra-cavity loss of a laser to generate the desired FM modulation. Other methods are also available, e.g., mirror loss modulation, intra-cavity loss modulation using a saturable absorber, etc. Thus, photon lifetime modulation is used here in the rate equations in order to illustrate the result of loss modulation on the AM and FM response of a laser, but is not intended to indicate that only one such method is available.

Figure 5:
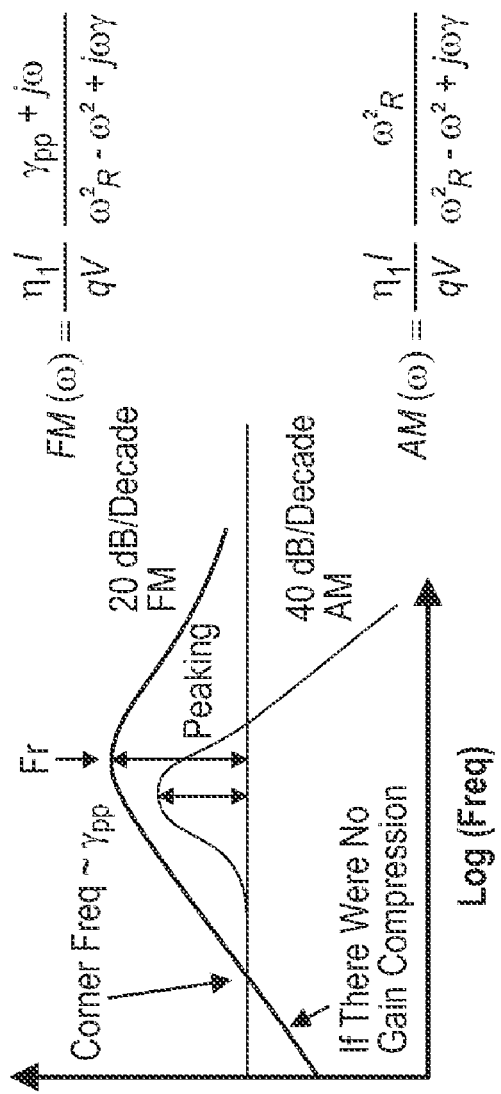
FIG. 5 illustrates AM and FM response for conventional gain modulation.

In order to elucidate the difference between conventional gain modulation and the loss modulation approach of the present invention, we can compare the small signal frequency response solutions of the rate equations for the two cases (i.e., conventional gain modulation and the loss modulation approach of the present invention). FIG. 5 describes the small signal frequency response to the rate equations for conventional high speed gain modulation of laser diodes, which produces amplitude modulation (AM) and frequency modulation (FM). As is known in the art, the AM response shows a peak at slightly lower frequency than a characteristic relaxation oscillation frequency, $f_r$, with a peak height of about 4 dB. The response rolls off beyond $f_r$ at a rate of 40 dB/decade. The FM response shows the peaking exactly at $f_r$ with a peak response of about 10 dB. The response rolls off beyond $f_r$ at a rate of 20 dB/decade. Therefore, with conventional current modulation of a laser diode, FM has a higher effective bandwidth.

Figure 6:
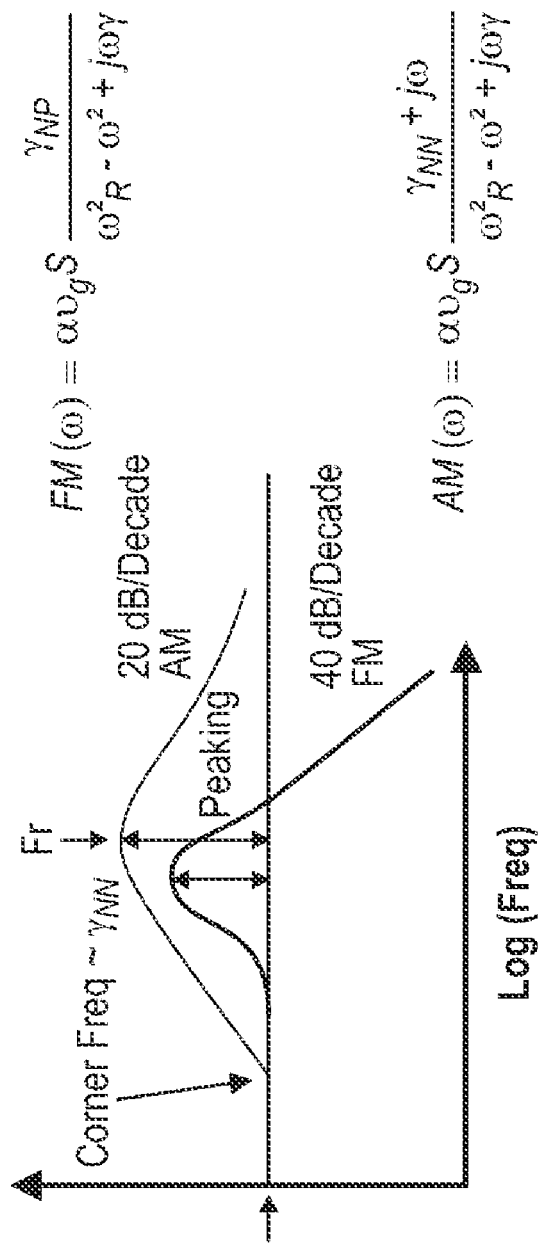
FIG. 6 illustrates AM and FM response for loss modulation.

In contrast, FIG. 6 shows the AM and FM response for intra-cavity loss modulation of a laser diode. In this case, the frequency response of AM and FM show reversed trends compared to that for conventional gain modulation. The AM response shows peaking at $f_r$ with a peak height of about 15 dB, and rolls off beyond $f_r$ at a rate of 20 dB/decade. The FM response shows a peak at a slightly lower frequency than $f_r$ with a peak response of about 4 dB. The response rolls off beyond $f_r$ at a rate of 40 dB/decade. Therefore, an enhancement in AM modulation bandwidth is expected for the intra-cavity loss modulation scheme, while FM modulation bandwidth will be lower than that for current modulation.

In another embodiment of the present invention, the FM response is enhanced by the addition of intra-cavity phase modulation.

Figure 7:
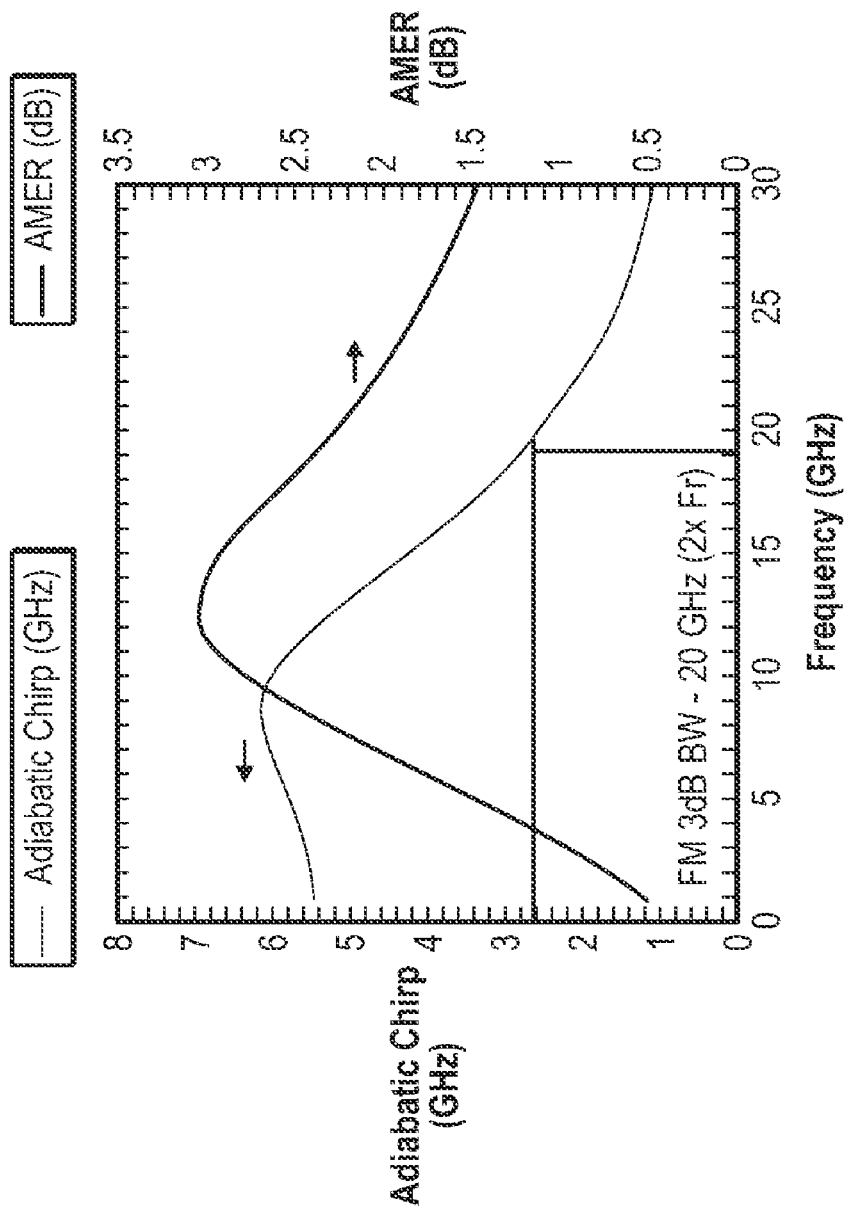
FIG. 7 illustrates AM and FM response for a +/−2% modulation of intra-cavity loss.

FIG. 7 shows the AM and FM response for +/−2% modulation in the intra-cavity loss. The corresponding modulation voltage for a typical EA modulator is about 0.2 Vpp. As the small signal analysis of the rate equation shows, the FM response shows relatively flat response up to the characteristic frequency $f_r$. The FM efficiency is as large as 5 GHz for the small modulation of 0.2 Vpp to the EA modulator section. The AM response shows the large peaking around $f_r$.

In one preferred embodiment of the present invention, the loss modulated FM source is used as the source in a chirp managed laser (CML), together with an optical spectrum reshaper (OSR) filter, as described in (i) U.S. patent application Ser. No. 11/037,718, filed Jan. 18, 2005 by Yasuhiro Matsui et al. for CHIRP MANAGED DIRECTLY MODULATED LASER WITH BANDWIDTH LIMITING OPTICAL SPECTRUM RESHAPER; (ii) U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT; and (iii) U.S. patent application Ser. No. 11/084,630, filed Mar. 18, 2005 by Daniel Mahgerefteh et al. for FLAT-TOPPED CHIRP INDUCED BY OPTICAL FILTER EDGE; which patent applications are hereby incorporated herein by reference.

Figure 8:
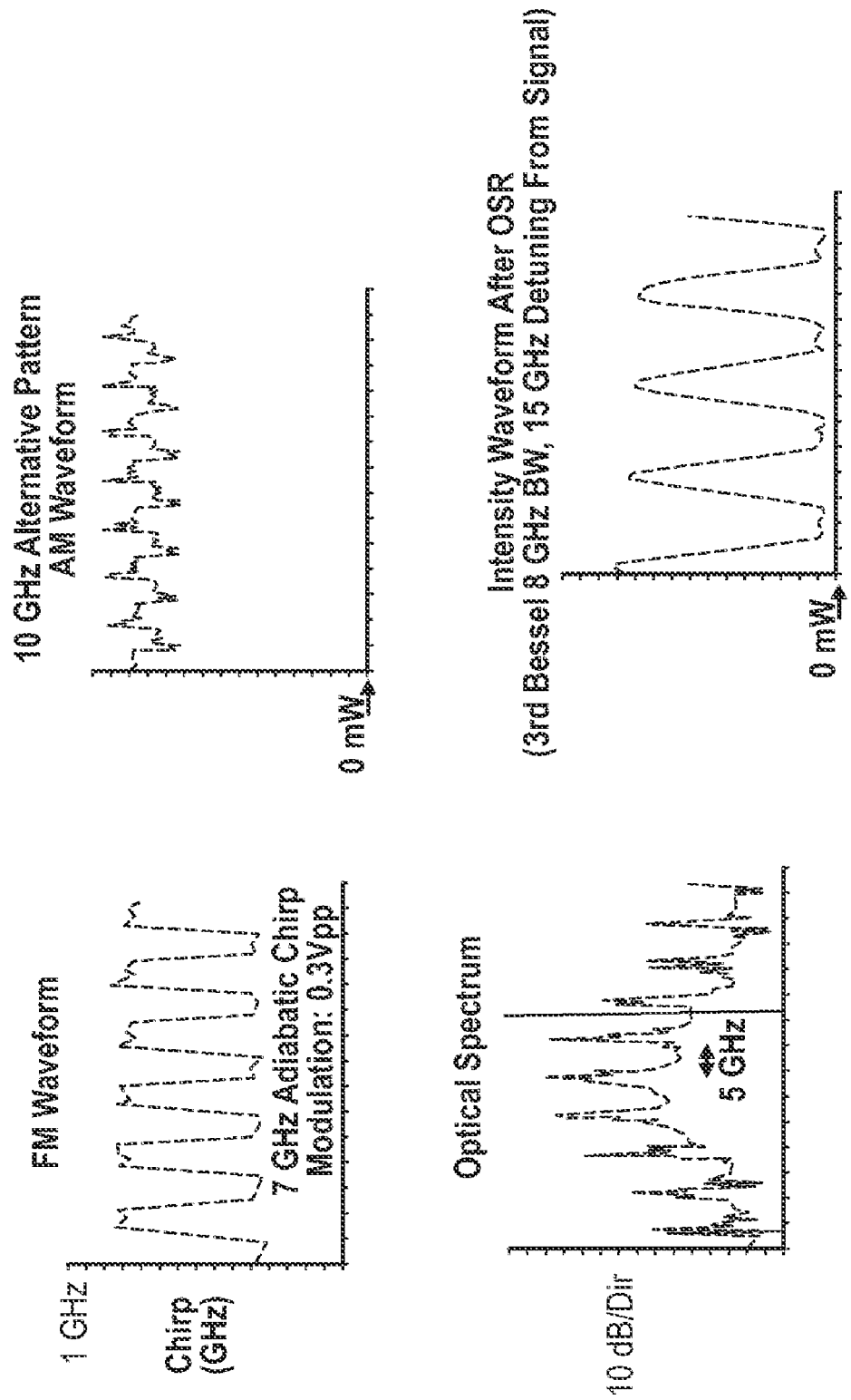
FIG. 8 illustrates AM and FM response as a function of time for loss modulation by a digital sequence of 1s and 0s.

FIG. 8 shows an example of modulation by a digital sequence, in which both AM and FM responses of a loss modulated laser are shown. FIG. 8 also shows the optical spectrum as well as the amplitude waveform after the signal has passed through an optical spectrum reshaper (OSR) filter, as prescribed in the chirp managed laser (CML) patent documents identified above. Among other things, the FM-to-AM conversion by the OSR filter increases the amplitude extinction ratio of the resulting signal.

Figure 9:
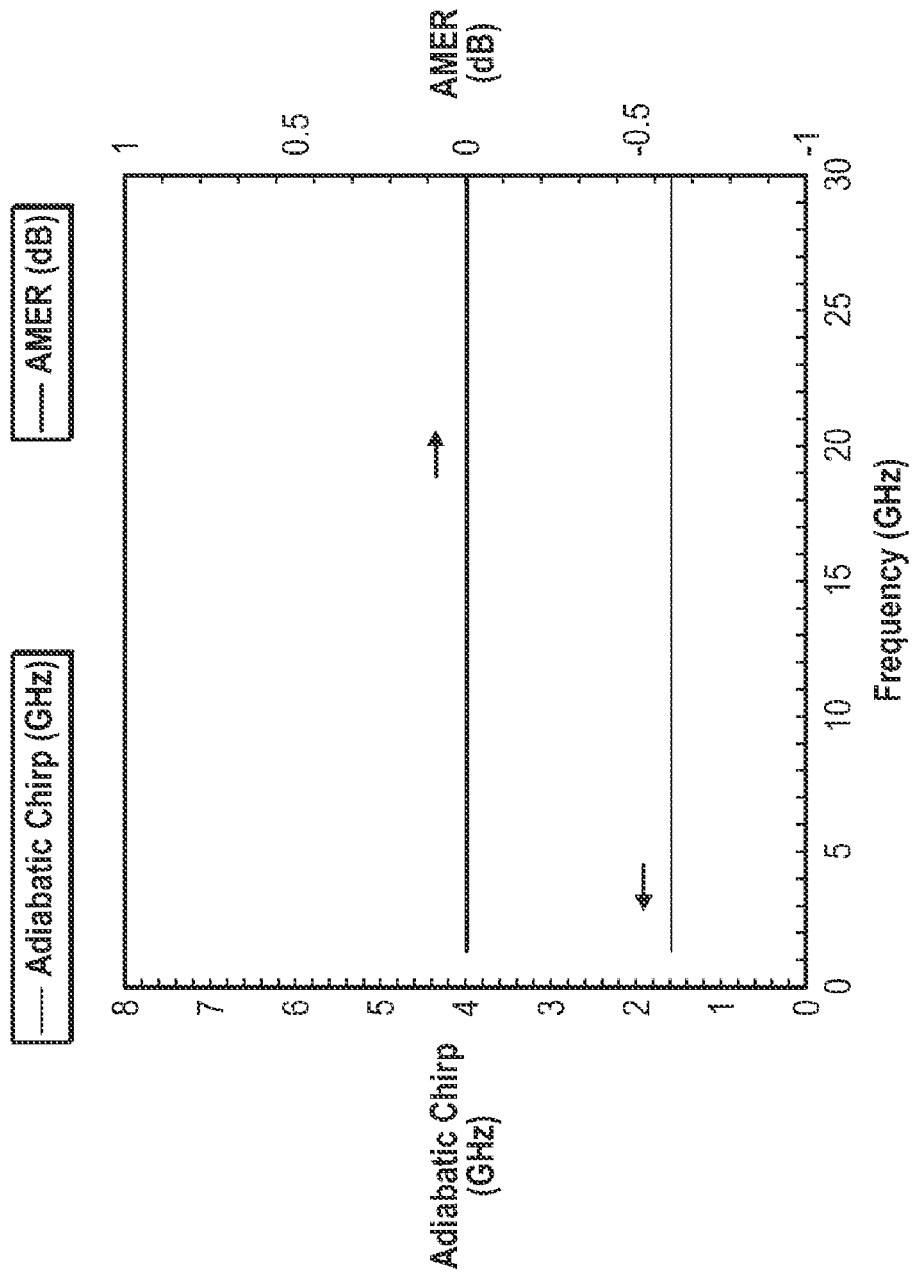
FIG. 9 illustrates AM and FM response for pure intra-cavity phase modulation.

In another embodiment of the present invention, and looking now at FIG. 9, only the phase is modulated inside the cavity. In this case, there is no AM modulation since gain is not affected, and the FM response can intrinsically be flat and only limited by the RC roll-off of the modulated section. As is evident in the rate equations, the phase of FM changes from 0 to π/2 as the modulation frequency is swept from DC beyond $f_r$. Since there is no timing delay between the modulation signal and the FM response generated by pure phase modulation in the cavity, the relative delay between loss-modulation induced FM and that induced by pure phase modulation changes with modulation frequency. At low frequencies, both are π out of phase, since the sign of FM by loss modulation and phase modulation are opposite, assuming that the QCSE (or Franz-Keldysh) effect is used to generate phase modulation.

Figure 10:
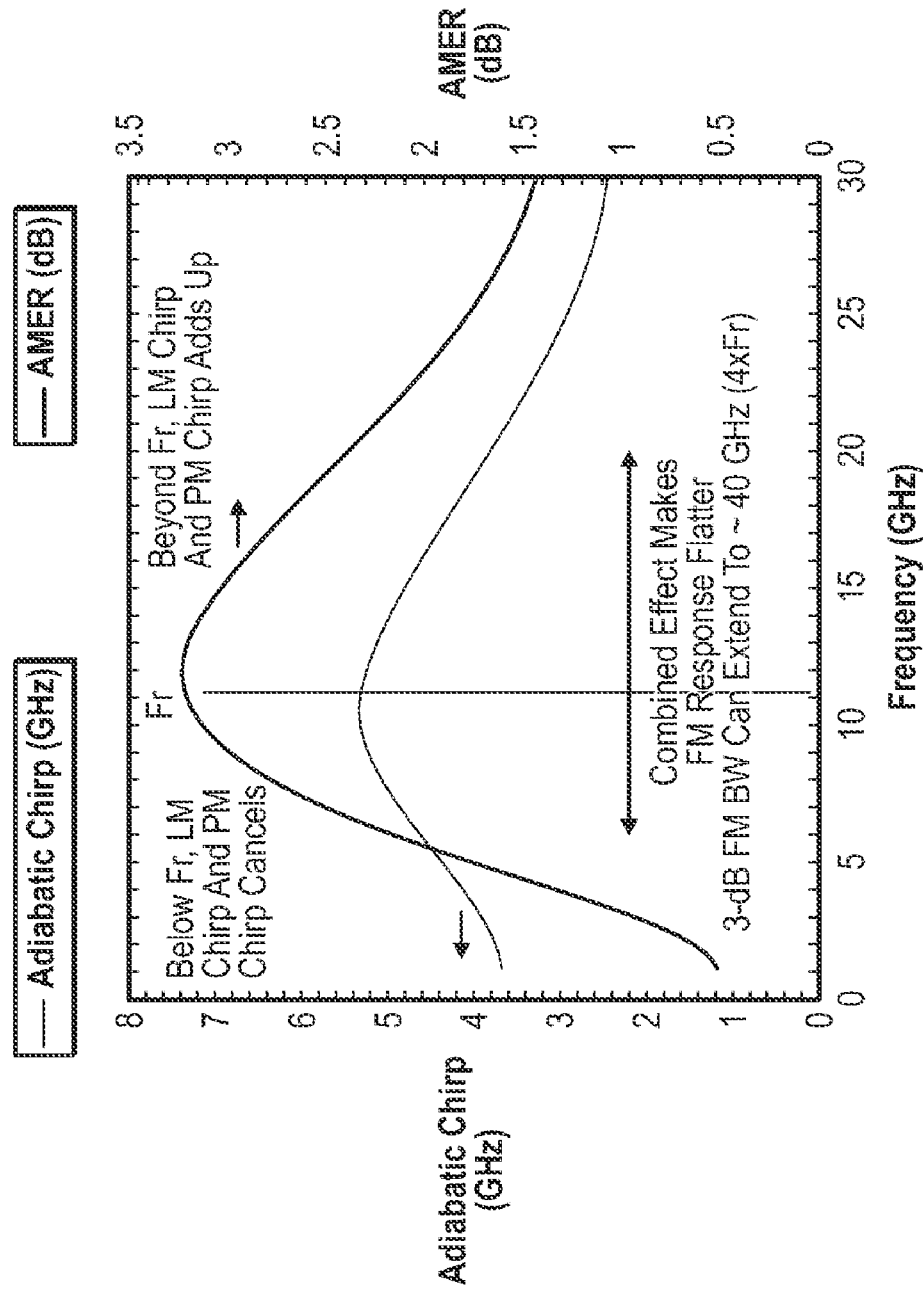
FIG. 10 illustrates AM and FM response for simultaneous intra-cavity loss and phase modulation.

FIG. 10 shows the case where both intra-cavity loss and phase modulation (which can be induced, for example, by reverse bias modulation in an EA section) are present. At low frequencies, the FM response drops as a result of competition between loss modulation and phase modulation in the EA section. At frequencies higher than $f_r$, the two effects add up so as to improve the FM response. It is, therefore, possible to design the FM response with a reasonably flat response up to approximately 40 GHz.

A variety of mechanisms can be used to induce modulation of loss in the cavity of a laser. These include, but are not limited to, (i) the quantum confined stark effect (QCSE); (ii) the Pockels effect; and (iii) the Franz-Keldysh effect. These are all different manifestations of a change in the absorption or index characteristics of a semiconductor material by the application of a voltage to the material, and are known in the art.

Intra-cavity loss modulation can be applied to a variety of monolithic laser designs. By way of example but not limitation, these include (i) distributed feedback (DFB) lasers; (ii) distributed Bragg reflector (DBR) lasers; (iii) sampled grating distributed Bragg reflector (SG-DBR) lasers; and (iv) Y branch DBR lasers. In each case, a new loss section of the laser needs to be added (e.g., an EA section or a saturable absorber section) in order to induce loss in the cavity. Alternatively, the mirror loss can be modulated in each case.

Other lasers can also be loss modulated so as to generate the desired FM. These include, but are not limited to, (i) external cavity lasers such as external cavity lasers with fiber Bragg gratings, ring resonators, planar lightwave circuit (PLC) Bragg gratings, arrayed waveguide gratings (AWG), and grating filters as external cavities; (ii) vertical cavity surface emitting lasers (VCSEL); and (iii) Fabry Perot lasers. All of the foregoing lasers, as well as other lasers, can also be loss modulated so as to generate the desired FM.

Referring to FIGS. 11 through 19, various laser cavity designs may be used to accomplish FM modulation using a phase modulator in the laser cavity. Conventional FM modulation by direct modulation of semiconductor laser diodes relies on the gain compression and associated imperfect clamping of the carrier density in the gain medium. This typically leads to a FM modulation efficiency of ~250 GHz/mA. The modulation bandwidth of FM modulation is slightly wider than that for AM modulation by direct modulation of laser. However still limited by the relaxation oscillation frequency of the laser.

An FM modulation scheme in accordance with embodiments of the present invention is based on the incorporation of an electro-optic (EO) phase modulator in the cavity. In the proposed FM modulation scheme, the EO effect in reverse biased phase modulator can create refractive index modulation of typically 0.1%. Assuming a typical optical confinement factor of 0.15 in the vertical direction and 0.2 in the longitudinal direction, the estimated FM modulation efficiency is 2 GHz/V. Further increase in the FM efficiency is achievable by increasing the length of the phase modulator. The limitation on modulation bandwidth is set by the RC cut-off frequency where C is the parasitic capacitance and R is the 50 ohm matching resistivity. The limitation by the parasitic capacitance can be removed by the design of a high-speed traveling wave electrode having effective 50 ohm impedance for the given C.

The advantage of high FM modulation bandwidth for the EO modulation in phase section of laser provides a path for wide bandwidth high FM modulation efficiency for the external cavity laser for tunable applications based on various filter types, such as a ring resonator, Bragg grating on PLC or fiber, DBR, SG-DBR, MG-Y. For the counterpart of direct modulation of gain region, on the other hand, the effective differential gain is reduced by a fraction of gain section with respect to the total cavity length, and thus reduced the modulation bandwidth as well as FM modulation efficiency.

The bandwidth of modulation for the reverse bias scheme to a passive laser section based on Pockels/Franz Keldysh/Wannier-Stark/QCSE effects is not limited by the differential gain, which is effectively reduced for the extended cavity laser by a factor defined for the fraction of active section to the total cavity length. In embodiments of the present invention, high speed modulation is achievable for long cavity DBR lasers and external cavity lasers with external ring resonator filters or Bragg gratings on a fiber or planar lightwave circuit (PLC).

Figure 11:
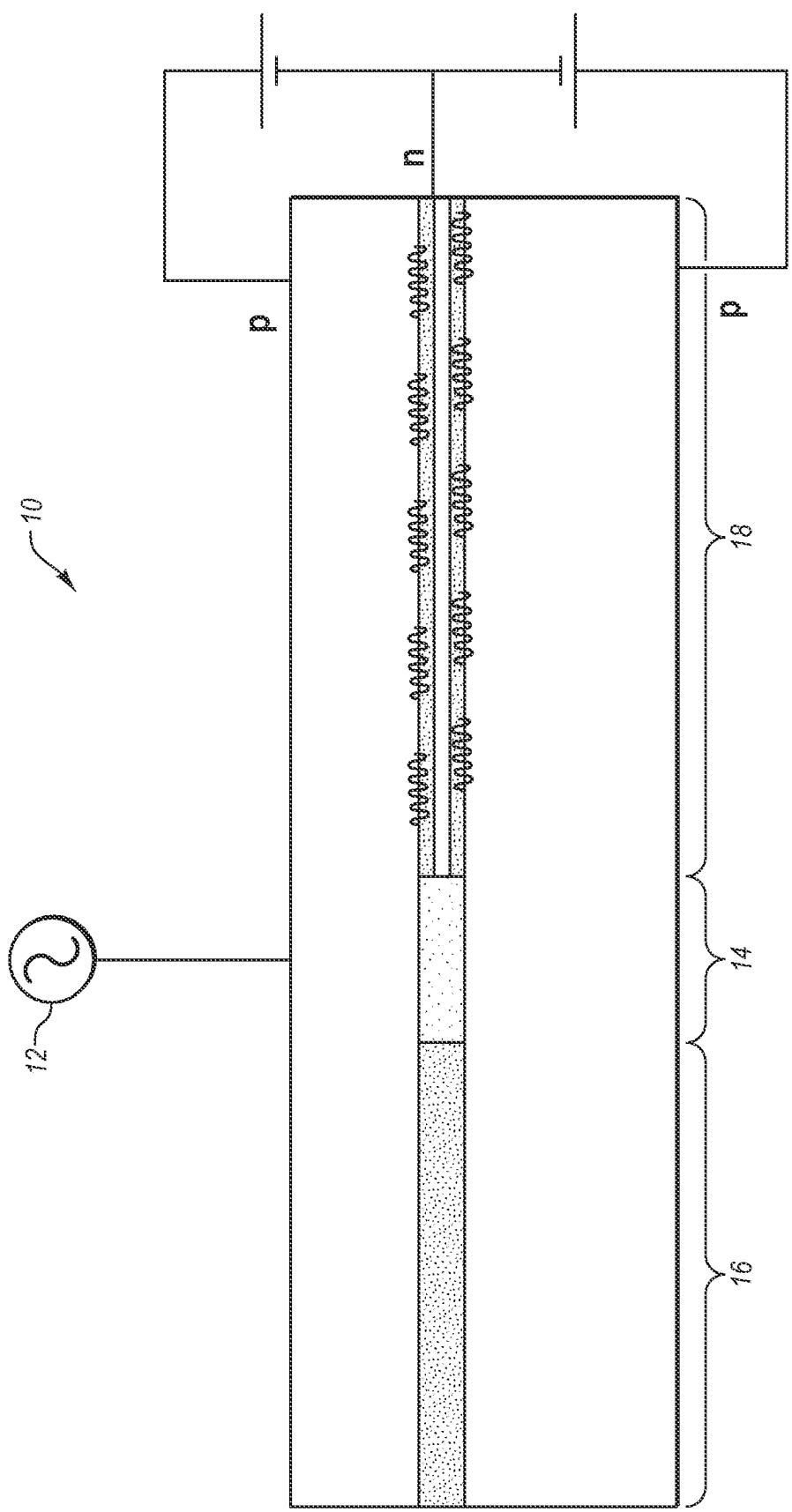
FIG. 11 illustrates a tunable twin guide sampled grating (TT-SG) distributed Bragg reflector (DBR) having intra-cavity phase modulation.

Referring specifically to FIG. 11, a laser 10 may be embodied as a tunable twin guide sampled grating distributed Bragg reflector (TTG-SG-DBR) laser. A modulation signal source 12 is applied to a passive phase section 14 of TTG-SG-DBR laser as shown. The laser 10 further includes a gain section 16 and a TTG section 18. The TTG section consists of two waveguides, each of which has slightly different grating pitch in order to exploit the Vernier effect for tuning of the laser.

Figure 12:
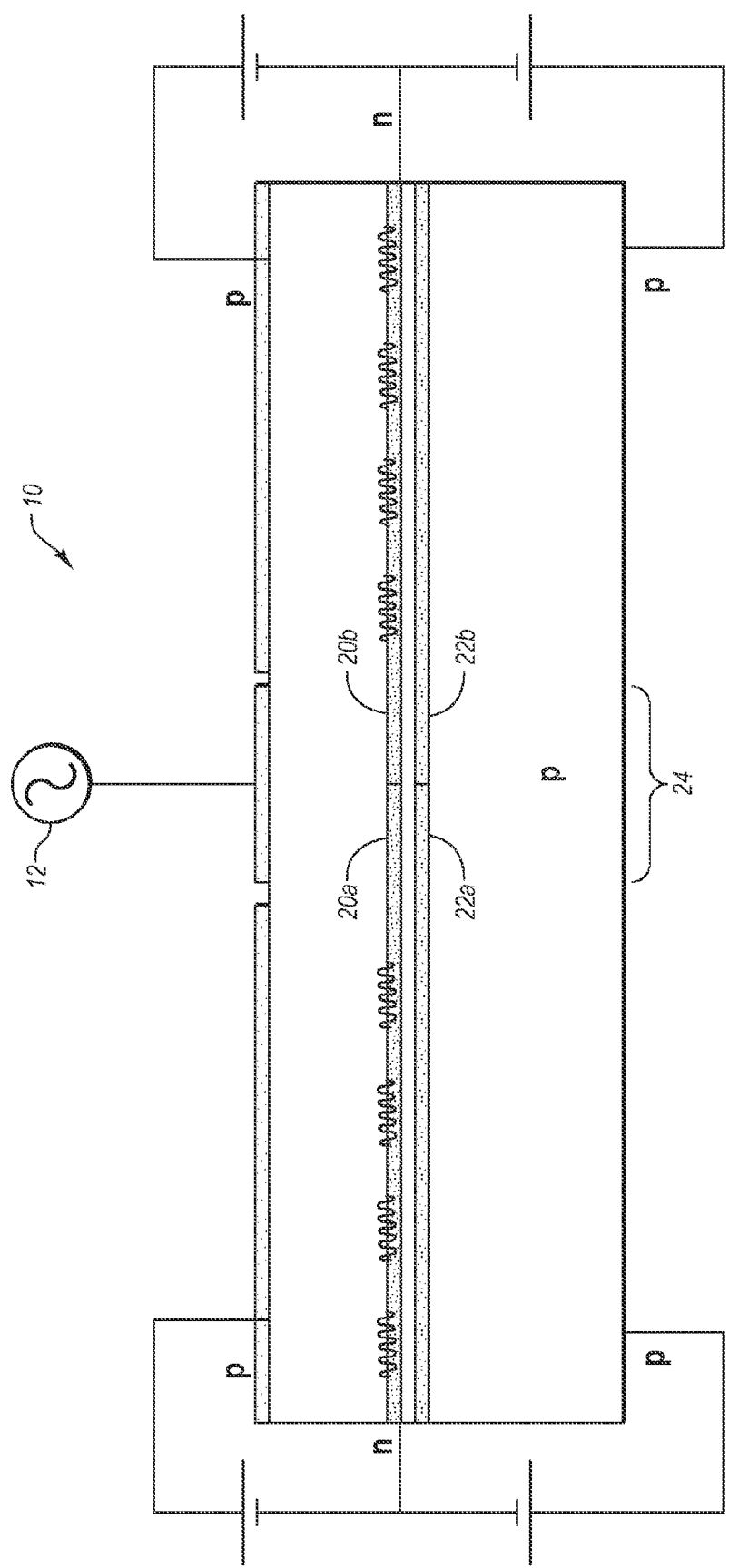
FIG. 12 illustrates a TT-SG distributed feedback (DFB) laser having intra-cavity phase modulation.

Referring to FIG. 12, in an alternative embodiment, a laser 10 is embodied as a two section TTG-DFB laser as shown, having two DFB waveguide sections 20a, 20b extending along gain sections 22a, 22b. In the illustrated embodiment, the phase modulated section 24 is positioned between the gain sections 22a, 22b in the same optical path as the gain sections 22a, 22b. However, the position of the phase modulated section 24 may be located at other positions within the laser cavity. The phase modulated section 24 is coupled to a modulation signal source 12.

Figure 13:
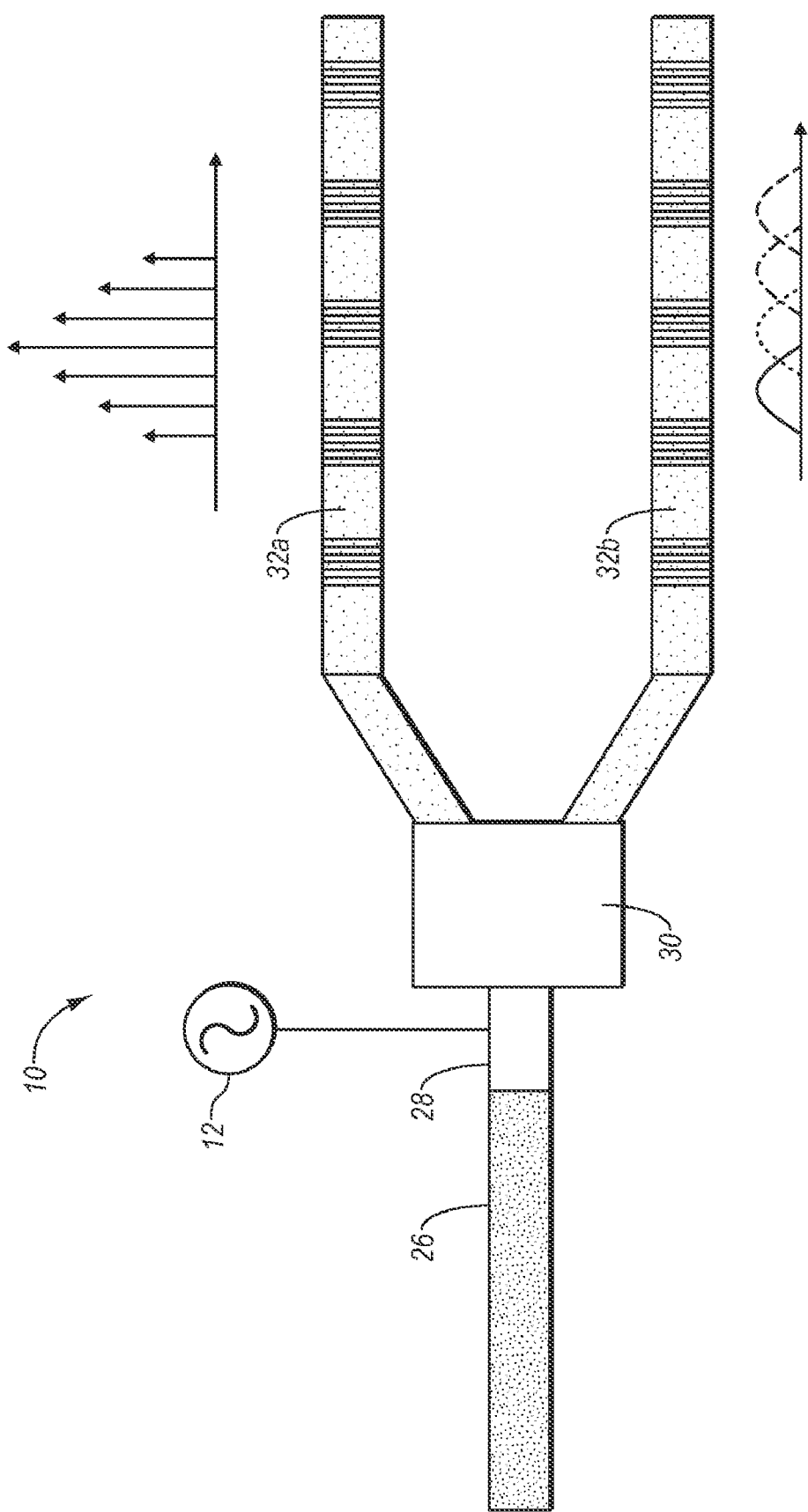
FIG. 13 illustrates a phase modulated Y-branch laser.

Referring to FIG. 13, in another alternative embodiment, the laser 10 is embodied as a Y-branch laser having a gain section 26 and a phase modulated section 28 coupled to a multi-mode interface (MMI) 30. A modulation signal 12 is applied to one or both of the phase modulated section 28 and MMI 30. Two gratings 32a, 32b are coupled to the MMI to enable tuning using the Vernier effect. The gratings 32a, 32b may both be sampled gratings, or one of the gratings 32a, 32b may be a phase grating.

Referring to FIGS. 14A-14D, in another alternative embodiment, the laser 10 is embodied as an external cavity laser having a gain section 34 and phase modulated section 36 optically coupled to a separate chip 38. The gain section 34 may be monolithically integrated with the phase modulated section 36 in another semiconductor chip. The chip 38 may be embodied as a flip-chip in passive alignment with either the phase modulated section 36 or gain section 34. The phase modulated section is coupled to a modulation signal source 12.

Referring specifically to FIG. 14A, the chip 38 may include an inlet waveguide 40 coupled to an MMI 40. Two waveguides 42a, 42b are coupled to the MMI. Each waveguide 42a, 42b is coupled to a resonator ring 44a, 44b. The resonator rings 44a, 44b preferably have different radii D1, D2 to enable tuning using the Vernier effect. Configuring the two resonator rings 44a, 44b in parallel reduces the effective length of the external cavity, and therefore improves the intrinsic modulation bandwidth of the laser 10

Figure 14B:
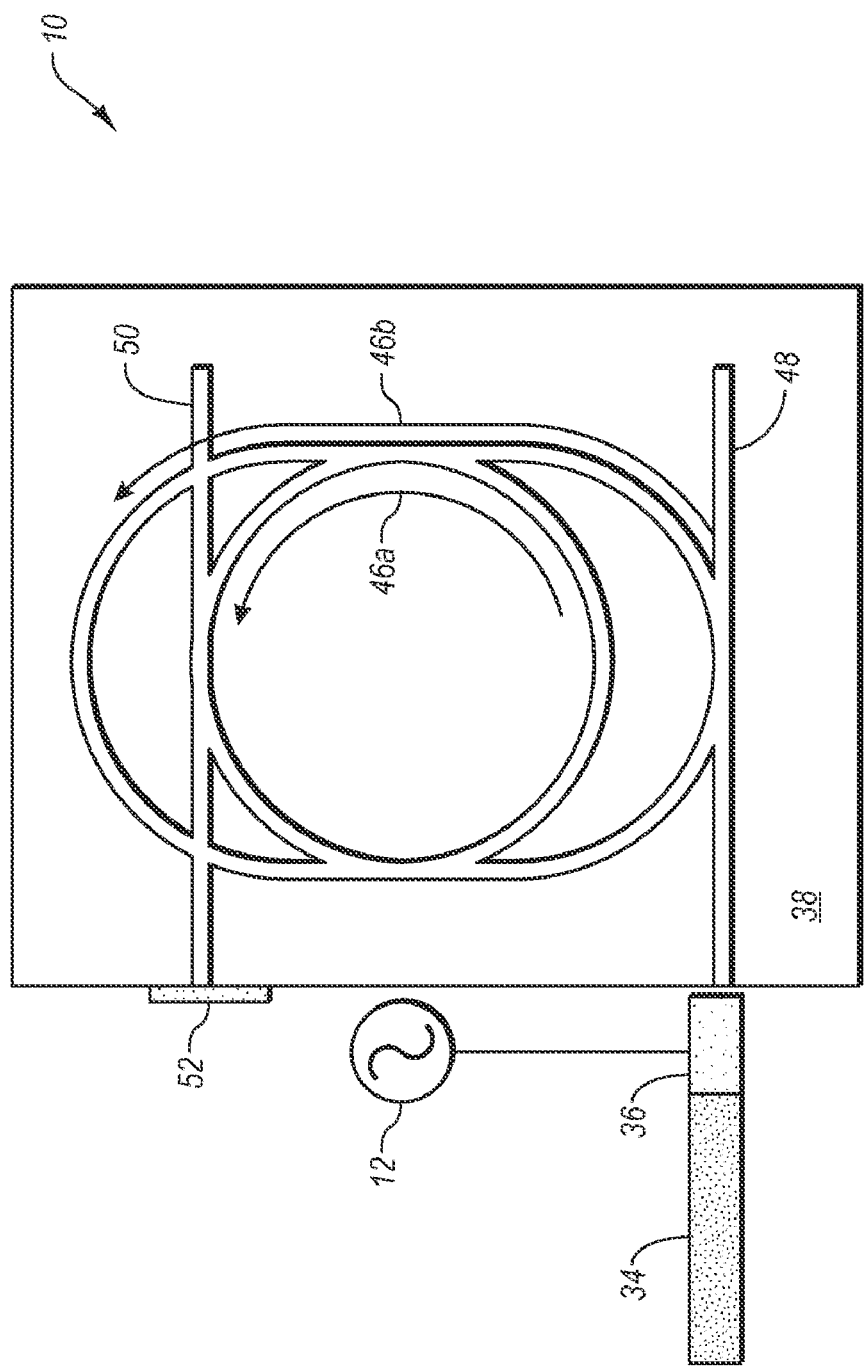
FIG. 14B illustrates a phase modulated external cavity laser having a multi-path ring resonator.

Referring to FIG. 14B, in another alternative embodiment, the chip 38 includes a multi-path resonator ring reflector. The chip 38 defines two paths 46a, 46b having lengths $\Lambda_1$ and $\Lambda_2$. The paths 46a, 46b are coupled to one another to define a third path having a length $\Lambda_3 = (\Lambda_1 + \Lambda_2)/2$. Path 46a is coupled to an input waveguide 48 and path 46b is coupled to an output waveguide 50. The input waveguide 48 receives light from the gain section 34 and phase modulated section 36. A highly reflective surface 52 is formed at one end of the output waveguide 50 to reflect light back through the multi-path resonator ring reflector.

The free spectral range (FSR) of the multi-path resonator ring reflector of FIG. 14B is determined according to the equation $FSR = N \times FSR_1 = M \times FSR_2$, where $\Lambda_2 = (M/N) \Lambda_1$, $L = M + N$, $FSR_1$ is the free spectral range of the first path 46a and $FSR_2$ is the free spectral range of the second path 46b. By using the two different path lengths for the circulation in the rings, the Vernier effect can be exploited without increasing external cavity length compared to the case of two serial rings.

Figure 14C:
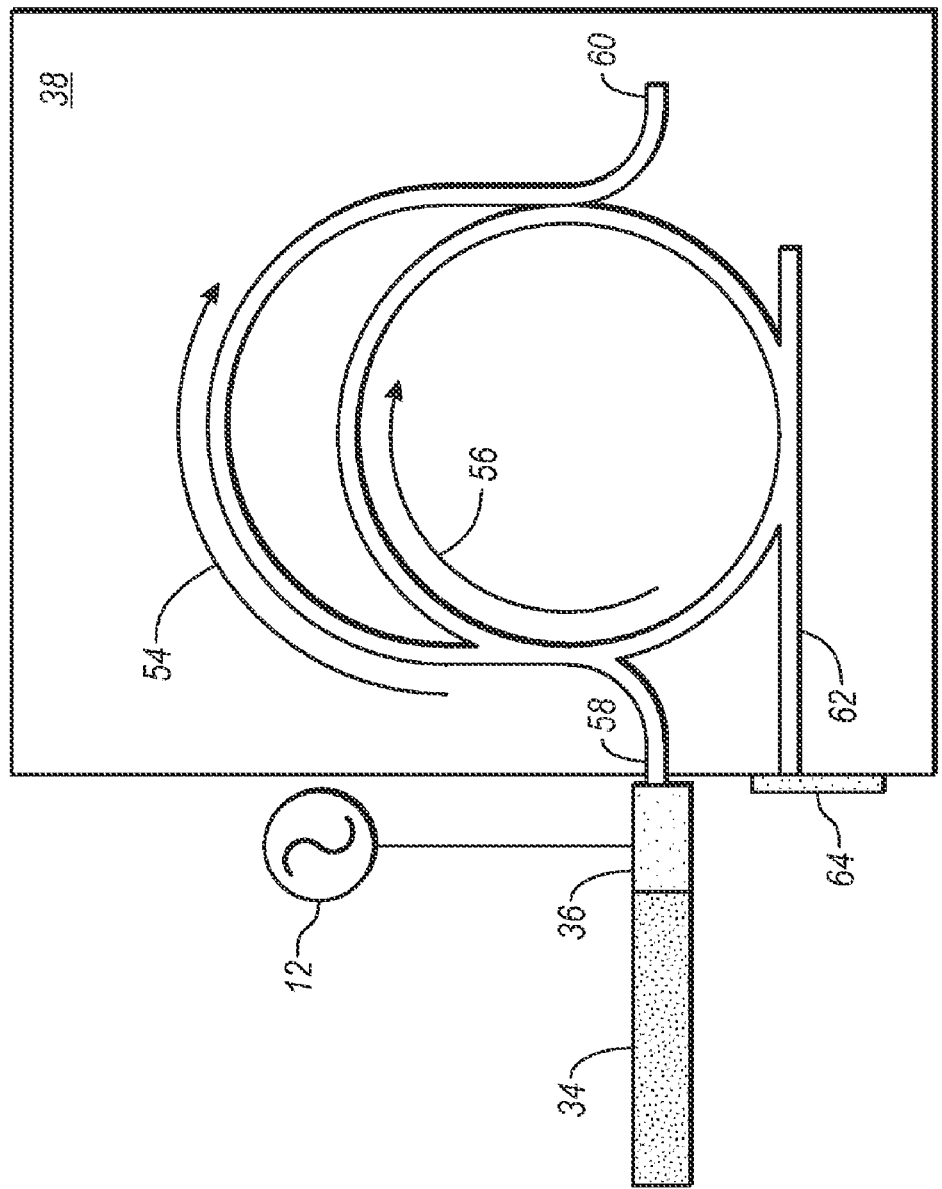
FIG. 14C illustrates a phase modulated external cavity laser having a triple coupler ring resonator.

Referring to FIG. 14C, in another alternative embodiment the chip 38 includes a triple coupler ring reflector. The embodiment of FIG. 14C provides a simplified version of the multi-path ring laser, while still enabling use of the Vernier effect for tuning. Compared to multi-path ring lasers, the triple coupler ring laser offers low cross talk between adjacent reflection peaks.

The chip 38 includes a first path 54 and a second path 56. The second path 56 is circular and is coupled to the first path 54 at points K1 and K2. A first end 58 of the first path 54 receives light from the gain section 34 and phase modulated section 36. A second end 60 of the first path 54 emits light into the chip 38. An output waveguide 62 is coupled to the second path 56 and has one end coupled to a highly reflective surface 64.

Referring to FIG. 14D, in another alternative embodiment, the chip 38 includes a single ring resonator 66. An input waveguide 68 is coupled to the ring resonator 66 and to the gain section 34 and phase modulated section 36. An output waveguide 70 is also coupled to the ring resonator 66 and has one end coupled to a highly reflective surface 72.

Polymer based material can be used for the waveguides in the chip 38 to enable high index change by temperature ($4 \times 10^{-4}$/° C.) for tuning by heating. The diameter of the ring resonator 66 may be chosen to minimize the radiation loss for the propagation of light in the ring, which is determined by the refractive index difference between the waveguide material and the chip 38. As an example, the minimum diameter for low loss ring for Polymide ($\Delta n \sim 22\%$) will be 10 μm (FSR~20 nm). In this case, the limited spectral bandwidth of the gain media can be used for selecting the single mode from the multiple reflection peaks for the ring resonator 66 separated by 20 nm.

Referring to FIG. 15, in another alternative embodiment, a laser 10 includes a gain section 74 and a phase modulated section 76, having the phase modulated section 76 coupled to modulation signal source 12. Light emitted from the gain section 74 and phase modulated section 76 is passed through a collimating lens 78. The collimating lens 78 directs a collimated light beam onto a grating waveguide structure (GWS) 80. The laser 10 of FIG. 15 may be tuned by changing the angle of the GWS to select which wavelengths are reflected back into the gain section 74.

Figure 16:
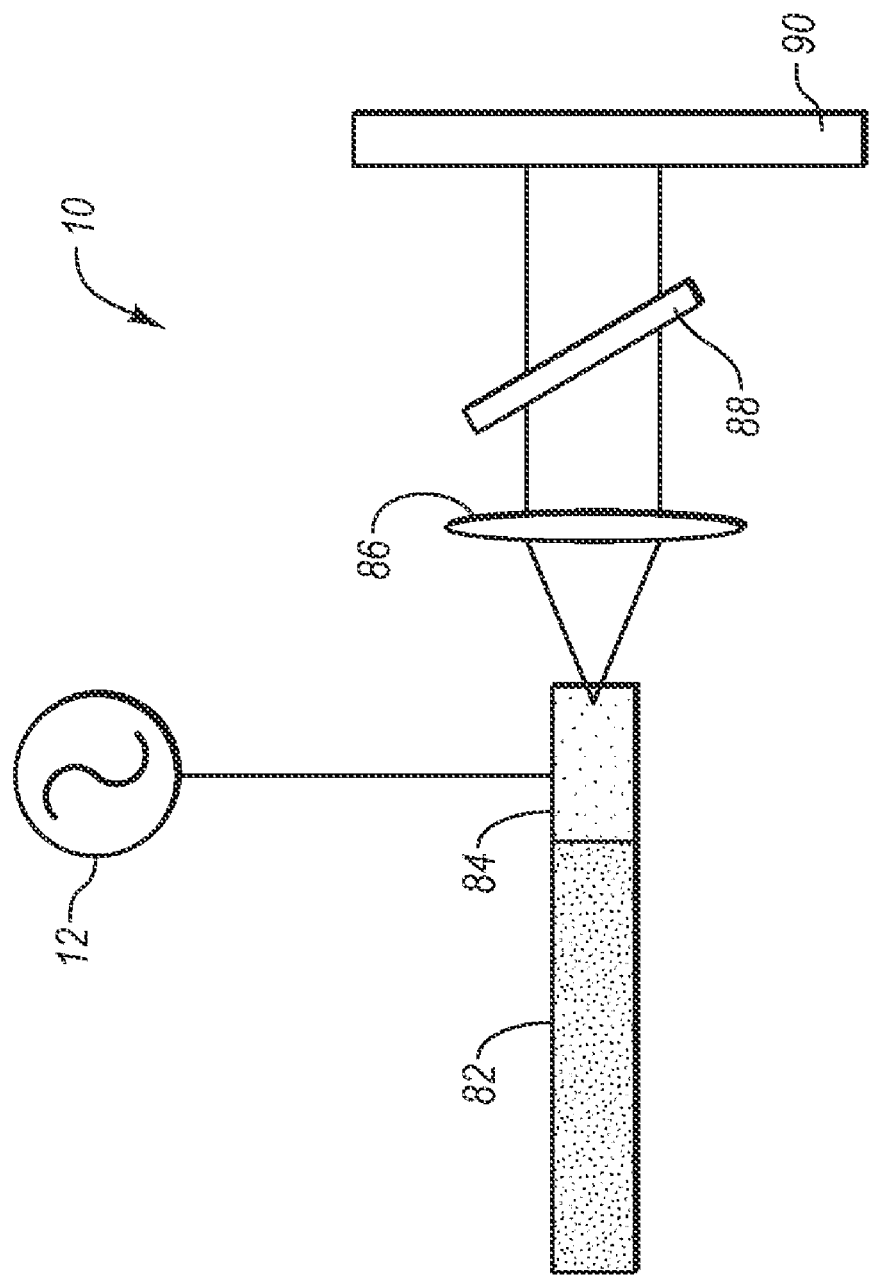
FIG. 16 illustrates a phase modulated external cavity laser having an etalon filter.

Referring to FIG. 16, in another alternative embodiment, a laser 10 includes a gain section 82 and a phase modulated section 84, having the phase modulated section 84 coupled to a modulation signal source 12. Light emitted from the gain section 82 and phase modulated section 84 is passed through a collimating lens 86. The collimating lens 86 directs a collimated light beam through an etalon filter 88 onto a mirror 90. The etalon filter 88 selects which wavelengths will be emitted by the laser 10. In the illustrated embodiment, wavelengths that transmit through the etalon 88 will be reflected back to the gain section 82, whereas wavelengths reflected by the etalon 88 will be directed away from the gain section 82. The etalon 88 may be tuned by means of an index change induced by a change in temperature.

In the above described embodiments of FIGS. 11-15, the modulation signal source 12 encodes data such that the when it is applied to the phase modulation section, a frequency shift keyed (FSK) signal encoding data results. In some embodiments, the gain section is simultaneously modulated in order to generate a signal that is both amplitude shift keyed (ASK) and FSK. In such embodiments, the AM and FM sidebands may be cancelled on the low frequency side to produce a single-sideband signal directly from the laser 10. For example, the OSR may have a transmission function chosen to cancel one of the side bands of the frequency modulated signal.

Figure 1:
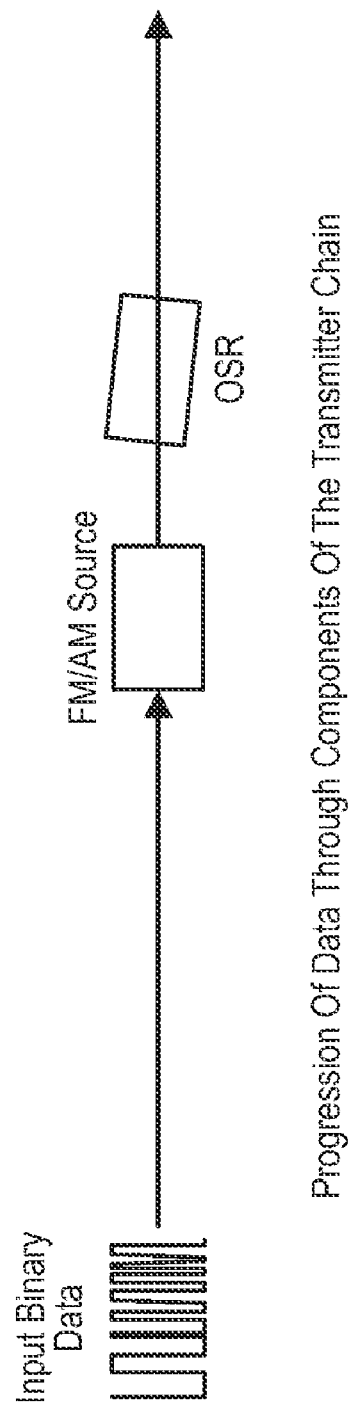
FIG. 1 is a schematic diagram showing a chirp managed laser transmitter.

The lasers 10 of FIGS. 11-16 may be used as the FM/AM source in the transmitter of FIG. 1. The OSR in such embodiments preferably has a transmission function chosen such that at least a portion of the frequency modulation resulting from modulation of the phase modulation section is converted into amplitude modulation. In some embodiments, the OSR has a 3 dB bandwidth between 0.5 and two times 1/T, where T is the bit rate of a data signal modulating the laser, as outlined in U.S. patent application Ser. No. 11/037,718, filed Jan. 18, 2005 by Yasuhiro Matsui et al. for CHIRP MANAGED DIRECTLY MODULATED LASER WITH BANDWIDTH LIMITING OPTICAL SPECTRUM RESHAPER.

In another embodiment, the frequency modulation of the phase section results in frequency excursions between a base frequency and a peak frequency, with the frequency excursions encoding a data signal. In some embodiments the difference between the base and peak frequency is between 0.25 and 0.75 times 1/T as explained in U.S. patent application Ser. No. 11/068,032, filed Feb. 28, 2005 by Daniel Mahgerefteh et al. for OPTICAL SYSTEM COMPRISING AN FM SOURCE AND A SPECTRAL RESHAPING ELEMENT.

The modulation of the phase section in the lasers 10 of FIGS. 11-16 can be used to compensate for fiber dispersion at the transmitter. For example, $3^{rd}$ order dispersion in a transmission fiber can be compensated by sinusoidal phase modulation of the pulse to be transmitted through the fiber.

Figure 17:
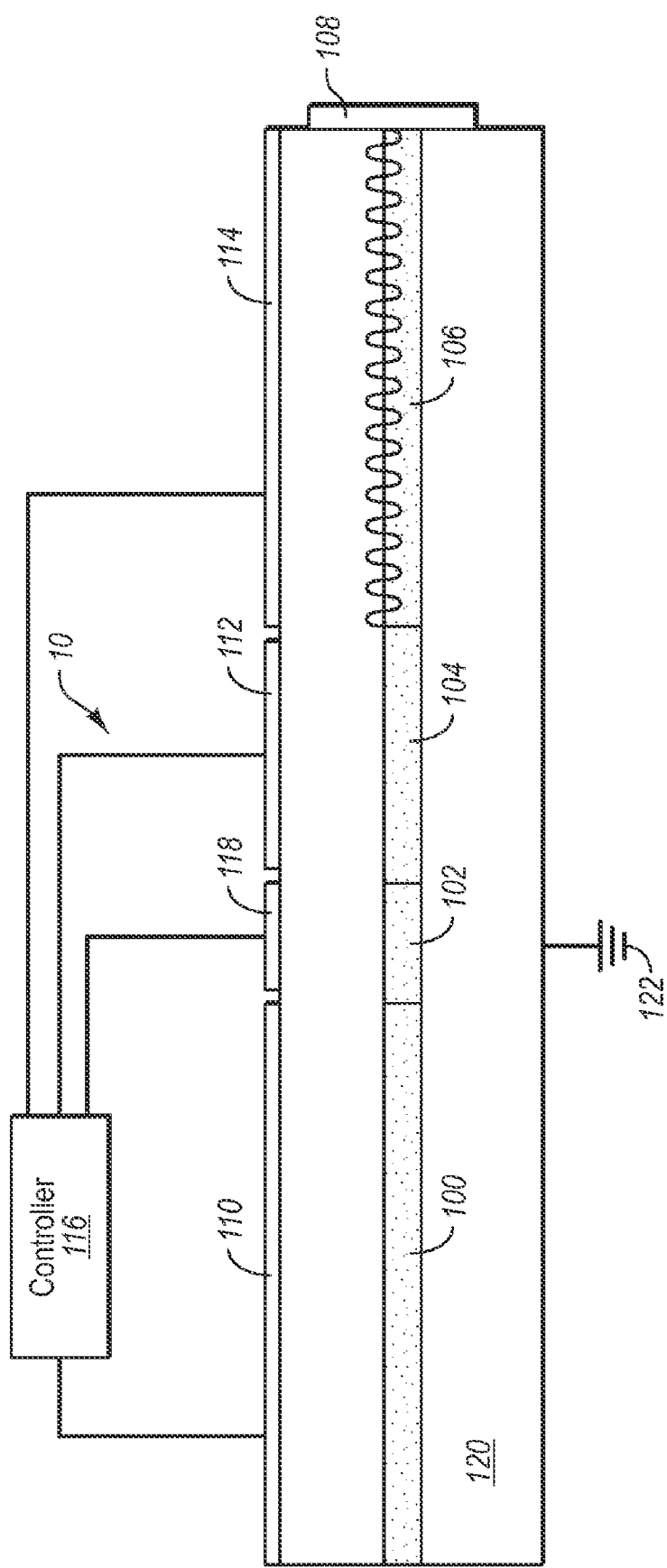
FIG. 17 illustrates an alternative embodiment of a DBR laser in accordance with an embodiment of the invention.

Referring to FIG. 17, in an alternative embodiment, a laser 10 includes a gain section 100, electro-absorption section 102, phase section 104, and a distributed Bragg reflector (DBR) section 106, positioned along the length of the laser in the order listed. In some embodiments, the order of the electro-absorption section 102 and phase section 104 may be reversed. A highly reflective coating 108 may be formed at an outer facet of the DBR section 106 in order to improve the output power of the laser. The highly reflective coating 108 may have a reflectivity such that its transmission is less than −20 dB, preferably less than −45 dB. In contrast with the embodiment of FIG. 2, the filter adjacent the gain section 100 may be omitted such that one end of the gain section 100 emits light out of an exposed facet.

In the embodiment of FIG. 17 the electro-absorption section 102 is preferably very short. For example, the electro-absorption section 102 may have a length less than about ten percent, preferably less than five percent, of the overall length of the illustrated laser. In some embodiments, the electro-absorption section has a length of about 10 μm.

In the illustrated embodiments, a gain electrode 110 positioned over the gain section, a phase electrode 112 positioned over the phase section 104, and a tuning electrode 114 positioned over the DBR section 106 are isolated from one another and receive a substantially DC current or voltage from a controller 116 programmed to supply such a signal. The controller 116 is programmed to couple a modulation signal encoding a data signal to an electro-absorption electrode 118 positioned over the electro-absorption section 102. In some embodiments, one or both of the tuning electrode 114 and phase electrode 112 are embodied as heaters that receive current for adjusting the temperature of the phase section 104 and/or DBR section 106.

In the illustrated embodiment, the gain section 100, electro-absorption section 102, phase section 104, and distributed Bragg reflector (DBR) section 106 are formed in a substrate 120, such as InP or some other semiconductor material suitable for the fabrication of semiconductor lasers. A lower layer of the substrate 120 may be coupled to ground 122 or some other reference voltage.

The light emitted from the gain section 100 may be coupled to an optical fiber by means of one or more optical element, such as an optical spectrum reshaper (OSR) as described hereinabove and in the pending applications and issued patents incorporated herein by reference.

Figure 18:
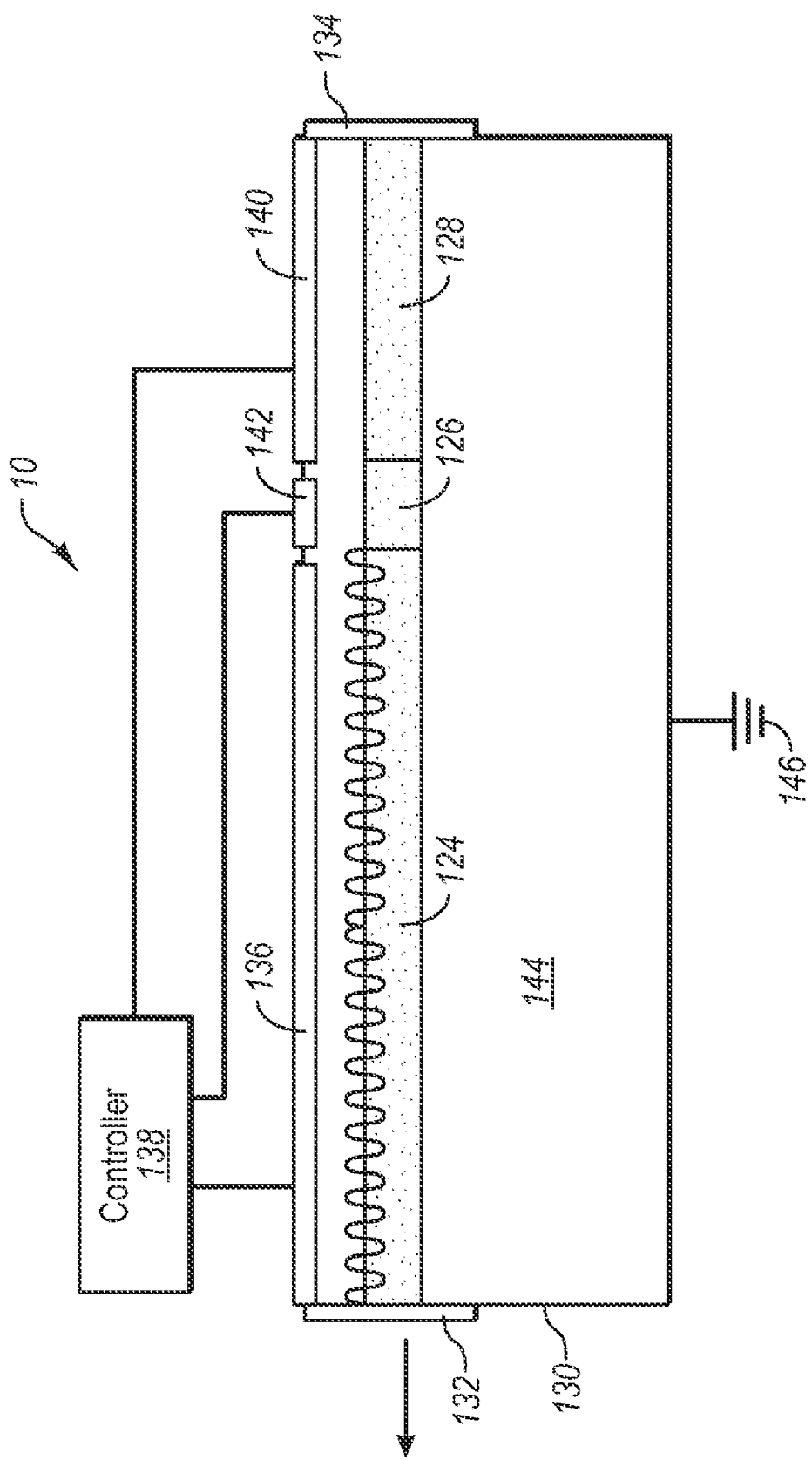
FIG. 18 illustrates an alternative embodiment of a DFB laser in accordance with an embodiment of the invention.

Referring to FIG. 18, in another alternative embodiment, the laser 10 includes a distributed feedback (DFB) section 124, an electro-absorption section 126, and a phase control section 128 positioned along the length of the laser in the order listed. The DFB section 124 may be embodied as a phase-shifted grating, such as a quarter wave-shifted grating, to improve mode-stability of the laser 10.

In the illustrated embodiment, the DFB section 124 is disposed between an output facet 130 of the laser and the electro-absorption section 126 and phase control section 128. In some embodiments, the ordering of the phase control section 128 and electro-absorption section 126 is reversed. In some embodiments, the output facet 130 abuts the DFB section 124. An anti-reflective coating 132 may be formed on the output facet 130. The anti-reflective coating 132 may have a reflectivity of less than −20 dB, preferably less than −45 dB. A highly reflective coating 134 may be formed opposite the anti-reflective coating. The highly reflective coating 134 may have a reflectivity such that its transmission is less than −20 dB, preferably less than −45 dB. The electro-absorption section 126 is disposed between the DFB section 124 and the highly reflective coating 134 such that the electro-absorption section 126 controls the amount of feedback light that returns to the DFB section 124. The phase control section 128 is positioned between the electro-absorption section 126 and the highly reflective coating 134 such that it controls the phase of feedback light. The amount and phase of feedback light reflected back into the DFB section 124 controls the magnitude and sign of adiabatic chirp induced in the output of the DFB section 124 through the output facet 130.

The electro-absorption section 126 preferably has a length substantially less than that of the DFB section 124 and the overall length of the laser 10. For example, in one embodiment, the electro-absorption section 126 has a length less than ten percent, preferably less than six percent that of the DFB section 124. In one exemplary embodiment, the DFB section 124 has a length of 350 µm, the electro-absorption section 126 has a length of 20 µm, and the phase control section 128 has a length of 100 µm.

In operation, a substantially DC voltage or current is imposed on a DFB electrode 136 over the DFB section 122 by a controller 138. A substantially DC voltage or current is also imposed on a phase electrode 140 positioned over the phase control section 128 by the controller 138. A modulating signal encoding data is imposed by the controller 138 on an electro-absorption electrode 142 positioned over the electro-absorption section 126. In alternative embodiments, modulation current encoding the data signal is also applied to one or both of the DFB electrode 136 and phase electrode 140.

In the illustrated embodiment, the distributed feedback (DFB) section 124, electro-absorption section 126, and phase control section 128 are formed in a substrate 144, such as InP or some other semiconductor material suitable for the fabrication of semiconductor lasers. A lower layer of the substrate 144 may be coupled to ground 146 or some other reference voltage.

The light emitted from the DFB section 124 through the electro-absorption section 126 will reflect back through the phase control section 128 and electro-absorption section 126 into the DFB section 124 and a portion will emit from the output facet 130 and be coupled to an optical fiber by means of one or more optical elements such as an optical spectrum reshaper (OSR) as described hereinabove and in the pending applications and issued patents incorporated herein by reference.

Figure 19:
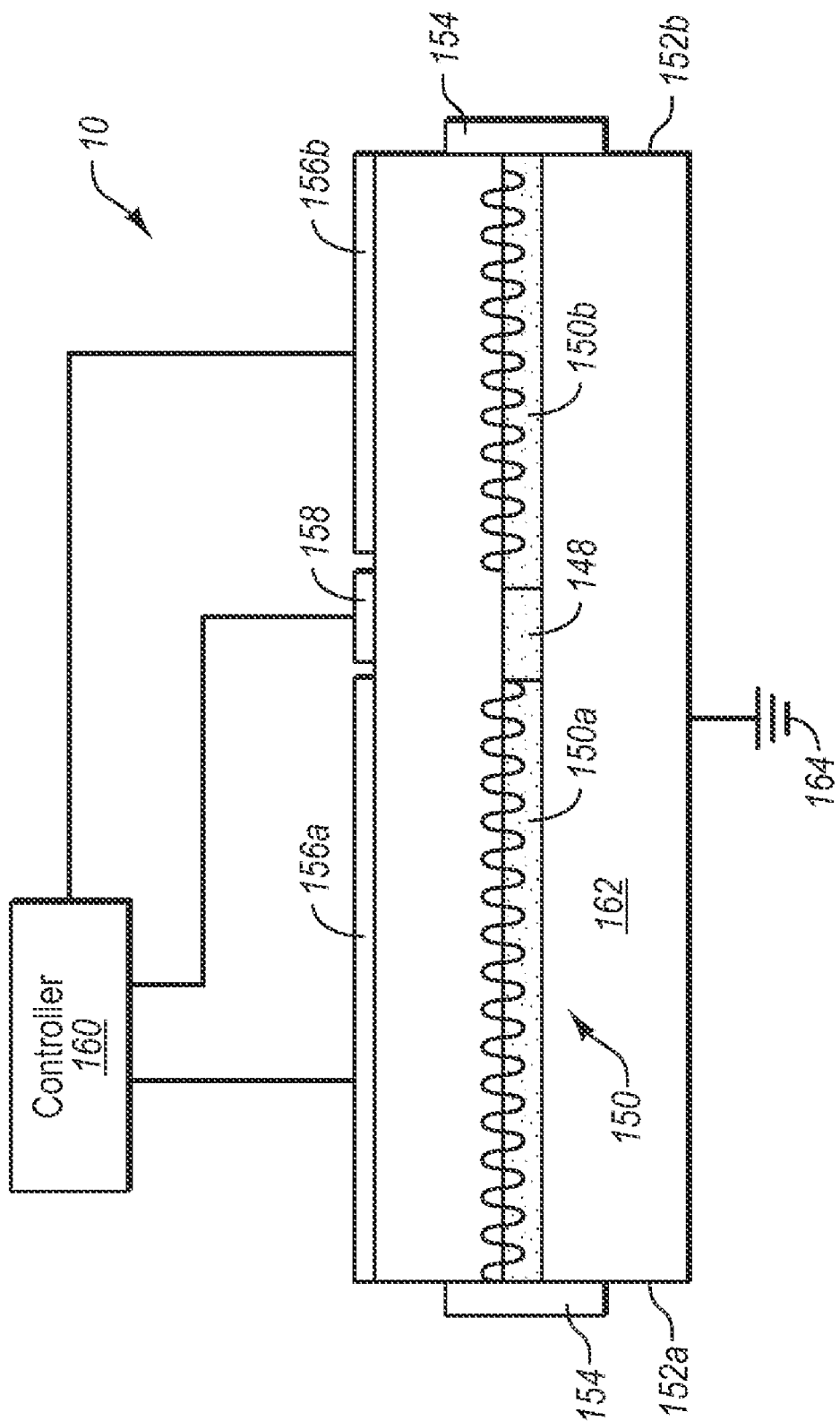
FIG. 19 illustrates another alternative embodiment of a DFB laser in accordance with an embodiment of the invention.

Referring to FIG. 19, in another alternative embodiment, a laser 10 is embodied as a distributed feedback laser having a grating imposed on a gain medium. In the illustrated embodiment, an electro-absorption section 148 is embedded in a distributed feedback section 150 such that segments 150a and 150b of the distributed feedback section 150 are located on either side of the electro-absorption section 148. The electro-absorption section 148 preferably has a length substantially less than the total length of the distributed feedback section 150. For example, the electro-absorption section 148 may have a length that is less than ten percent, preferably less than six percent, of the length of the distributed feedback section 150. In the illustrated embodiment, the electro-absorption section 148 has a length of 10 µm.

Facets 152a, 152b may abut the segments 150a, 150b, respectively, of the distributed feedback section 150. Anti reflective coatings 154 may be formed on one or both of the facets 150a, 150b. The light emitted from one of the facets 152a, 152b may be coupled to an optical fiber by means of one or more optical elements such as an optical spectrum reshaper (OSR) as described hereinabove and in the pending applications and issued patents incorporated herein by reference.

First and second gain electrodes 156a, 156b are positioned over the segments 150a, 150b respectively. A modulation electrode 158 is positioned over the electro-absorption section 148. A controller 160 is electrically coupled to the electrodes 156a, 156b and imposes a substantially DC voltage or current thereon. The current injected into the segments 150a, 150b is preferably above the lasing threshold current of the gain medium of the distributed feedback section 150. The controller 160 is electrically coupled to the modulation electrode 158 and imposes a modulation signal encoding digital data thereon.

In the illustrated embodiment, the distributed feedback (DFB) section 150 and electro-absorption section 148 are embedded in a substrate 162, such as InP or some other semiconductor material suitable for the fabrication of semiconductor lasers. A lower layer of the substrate 162 may be coupled to ground 164 or some other reference voltage.

DFB lasers can have strong spatial hole burning effect, wherein feedback of the distributed grating creates a strong nonuniform distribution of photons in the laser cavity. Nonuniformity of photon density in the cavity leads to nonuniform carrier distribution due to carrier depletion by stimulated emission, known as spatial hole burning. Because of this effect, DFB lasers can therefore have higher FM efficiency compared to Fabry-Perot (FP) or DBR lasers. In the embodiment of FIG. 19, high FM efficiency may be achieved by efficiently changing the intensity of circulating light by affecting laser cavity within the DFB grating itself, which therefore affects the phase condition of lasing and thus cavity loss changes.

In an experiment conducted by the inventor a phase shifted DFB laser mas fabricated having an electro-absorption section having a length of 6 µm positioned within a distributed feedback section 150. In this case, the electro-absorption section 148 was made using a structure identical to the MQW structure for the gain material within the distributed feedback sections 150a, 150b. The distributed feedback sections 150a, 150b were driven by electrodes 156a, 156b and the electro-absorption section was driven by an electrode 158. The section of the distributed feedback section 150 adjacent the electrode 158 was operated as a saturable absorber. 24 GHz of FM was achieved for 2 Vpp. The frequency response was above 8 GHz.

Improved results may be obtained by using an electro-absorption section 148 formed using an actual electro-absorber structure rather than a saturable absorber. An electroabsorber may also provide the advantage of having a bandgap shift relative to the gain medium of the distributed feedback section 150. This may reduce fixed loss which that do not contribute to frequency modulation, but rather degrade the speed of laser.

In an alternative embodiment, the electro-absorption section 148 in the embodiment of FIG. 19 is replaced by a saturable absorber. The saturable absorber may be embodied as a segment of the distributed feedback section between the distributed feedback sections 150*a*, 150*b* that is modulated below the lasing threshold in order to modulate the loss induced by the saturable absorber. The saturable absorber may therefore have the same structure and include the same material as the remainder of the distributed feedback section 150.

Figure 20:
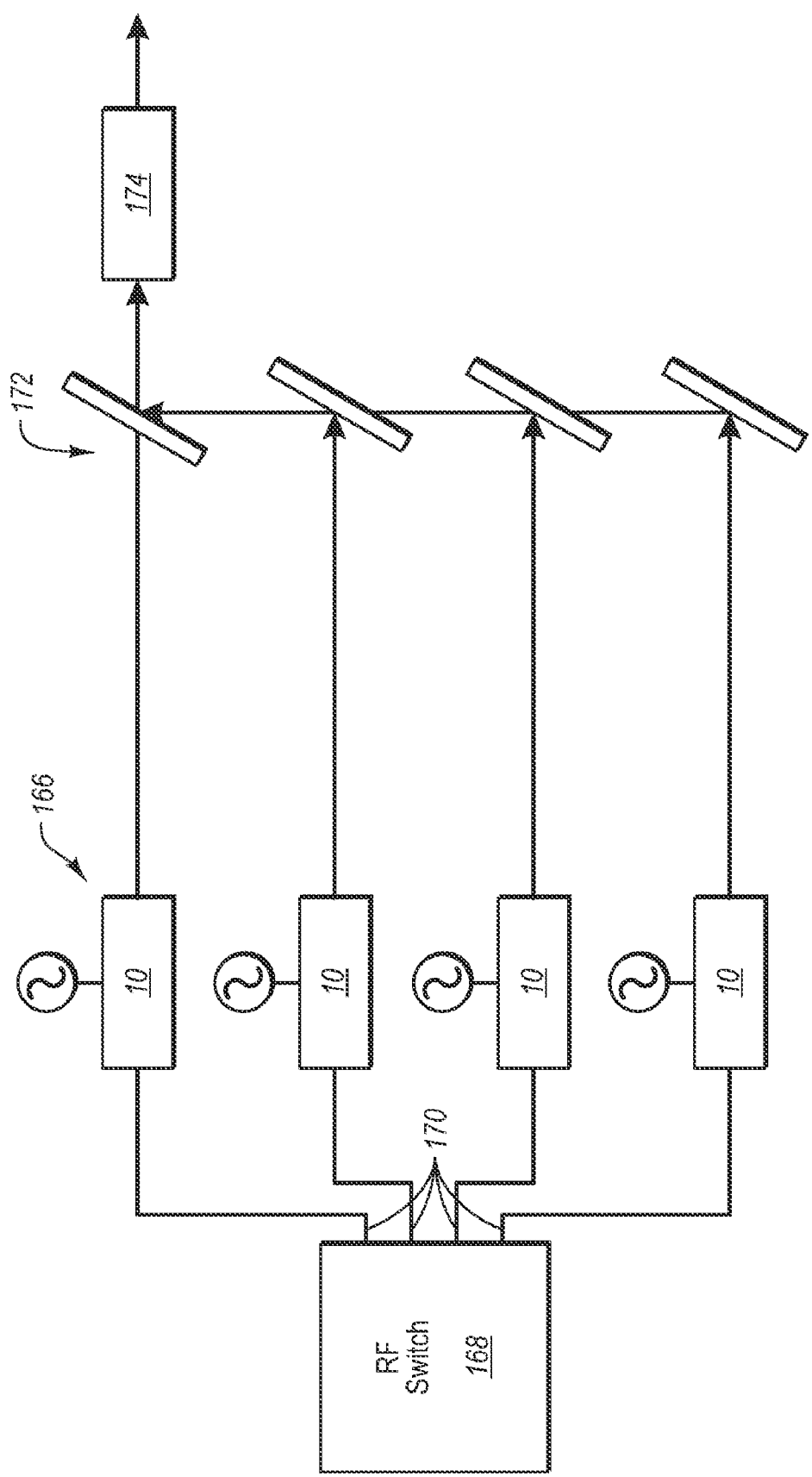
FIG. 20 illustrates a widely tunable transmitter array in accordance with an embodiment of the invention.

Referring to FIG. 20, lasers according to the foregoing embodiment may be particularly useful for widely tunable laser transmitters. It is advantageous, for example, for a laser transmitter to span the C or L bands of frequencies in order to provide greater versatility. One approach for achieving wide tunability is to use an array 166 of lasers 10 that are each tunable to a subset of a desired range of frequencies. The array 166 is typically coupled to a radio frequency (RF) switch 168 that couples high frequency input data to each of the lasers of the array. The number of output ports 170 of an RF switch and the maximum output current of each port may limit the number of lasers that may be driven by a given RF switch.

The outputs of the lasers 10 may be multiplexed using a wave division multiplexer (WDM) 172 and transmitted through an optical spectrum reshaper (OSR) 174. The OSR 174 preferably has periodic transmission edges and is tunable such that a transmission edge may be positioned at various points on the tunable range of the array 166. In operation, a laser 10 of the array is driven with a modulation signal to generate a frequency modulated signal modulated between a base frequency and a peak frequency. The OSR 174 is preferably tunable to align one of the transmission edges thereof with respect to the base and peak frequency such that the base frequency component is attenuated relative to the peak frequency, which converts at least a portion of frequency modulation in the output of the laser 10 to amplitude modulation.

Lasers 10 in accordance with the above described embodiments provide the advantage of having high frequency modulation (FM) efficiency (GHz/mA). Because of the reduced power requirements of the lasers 10, the limited power output of the RF switch 168 is sufficient to drive multiple lasers on each port 170. The range of frequencies that may be emitted from the array 166 is therefore increased for a given tuning band for each individual laser.

Lasers 10 in accordance with the above described embodiments also are particularly suited for performing differential phase shift keying (DPSK), quadrature phase shift keying (QPSK), and, more generally, differential N-phase shift keying, such as is described in co-pending application Ser. No. 12/014,676, filed Jan. 15, 2008, which is hereby incorporated herein by reference. The large frequency modulation efficiency of the lasers 10 described hereinabove enables a large number of different frequency levels and corresponding phase shifts and therefore increases the corresponding number of data symbols that may be encoded by each pulse.

Figure 21:
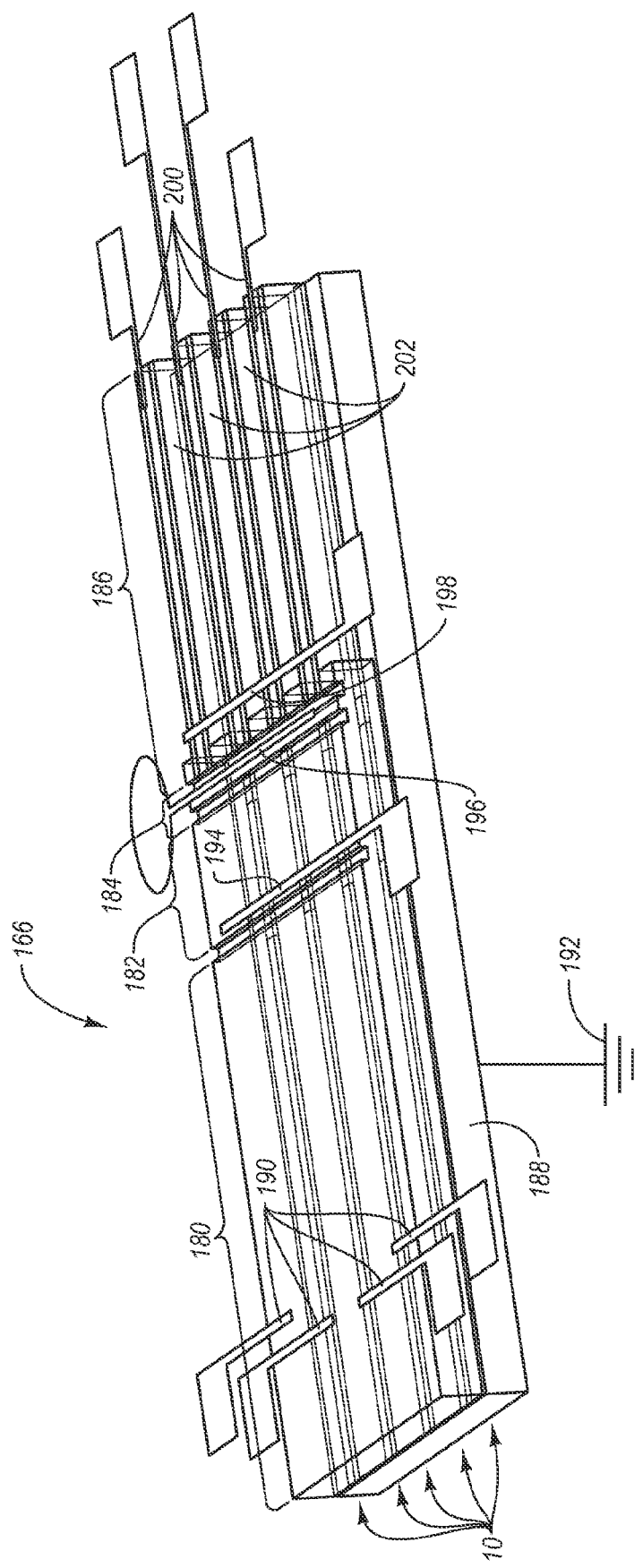
FIG. 21 illustrates a laser array integrated into a single chip.

Referring to FIG. 21 a laser array 166 including lasers 10 according to the foregoing embodiments may be integrated into a single chip as illustrated. For example, a number of lasers 10 each having a gain section 180, phase section 182, electro-absorption section 184, and DBR section 186 may be formed parallel to one another on a common substrate 188. The gain section 180 of each laser 10 is coupled to a separate contact 190 that are each independently controlled by a controller. Current may flow from the contact 190 to a reference voltage 192 such as ground coupled to a lower layer of the substrate 188. The phase section 194 may include a single contact 194 supplying current to the phase sections 182 of all of the lasers in the array 166. A single contact 196 may supply current to the electro-absorption sections 184 of all of the lasers. In use, a laser 10 selected to emit light encoding a data signal is controlled by supplying a bias current to the contact 190 of the selected laser 10 while refraining from powering the contacts 190 of the other lasers 10 in the array 166. In this manner, modulation of the common contact 196 will only modulate the output of the selected laser 10.

The temperature of the DBR sections 186 may be controlled by a first contact 198 coupled to one end of all of the DBR sections 186 and individual contacts 200 coupled to one of the DBR sections 186. A controller coupled to the contacts 200 independently controls the current supplied to each DBR section 186. The DBR sections 186 may be somewhat thermally isolated from one another by means of trenches 202 formed between adjacent DBR sections 186. Heating of the DBR sections 186 may cause some heating of the electro-absorption sections 184. However, heating of the electro-absorption sections 184 may be advantageously used to adjust the detuning between the lasing wavelength of a laser 10 and the band-gap wavelength of the electro-absorption section.

It will be understood that many changes in the details, materials, steps and arrangements of parts, which have been herein described and illustrated in order to explain the nature of the invention, may be made by those skilled in the art without departing from the principles and scope of the present invention.

What is claimed is:

1. A fiber optic communication system comprising:
an optical signal source adapted to produce a frequency modulated first signal, the optical signal source comprising:
a gain section having a distributed feedback grating imposed thereon;
an electro-absorption section embedded in the gain section having the distributed feedback grating extending on either side of the electro-absorption section;
first and second gain electrodes positioned over portions of the gain section on opposite sides of the electro-absorption section;
a modulation electrode positioned over the electro-absorption section; and
a controller in electrical communication with the first and second gain electrodes and the modulation electrode, the controller programmed to impose a substantially DC signal on the first and second gain electrodes and to impose a modulation signal encoding digital data on the modulation electrode; and
an optical spectrum reshaper adapted to reshape the first signal into a substantially amplitude modulated second signal.

2. The fiber optic communication system of claim 1, wherein the optical signal source further comprises antireflective coatings formed near opposite ends of the gain section.

3. The fiber optic communication system of claim 1, wherein the electro-absorption section has a length less than ten percent that of the gain section.

4. The fiber optic communication system of claim 1, wherein the electro-absorption section has a length of less than six percent that of the gain section.

5. The fiber optic communication system of claim 1, wherein the electro-absorption section has a length of about 10 µm.

6. The fiber optic communication system of claim 1, wherein the distributed feedback grating is a phase shifted grating.

7. The fiber optic communication system of claim 1, wherein the electro-absorption section comprises a material having a bandgap shifted with respect to the gain section.

8. The fiber optic communication system of claim 1, wherein the electro-absorption section comprises a material having a bandgap wavelength that is shorter than that of the gain section.

9. A method for transmitting data comprising:
   biasing first and second segments of a distributed feedback gain section above a lasing threshold of the distributed feedback gain section;
   imposing a modulation signal encoding data on a loss segment of the distributed feedback gain section to generate a frequency modulated first signal, the modulation signal modulating the loss segment below the lasing threshold, the loss segment being located between the first and second segments; and
   at least partially transforming the first signal into a substantially amplitude modulated second signal by transmitting the first signal through an optical spectrum reshaper.

10. The method of claim 9, wherein the loss segment is substantially shorter than the first and second segments.

11. The method of claim 9, wherein the loss segment has a length less than six percent that of a combined length of the first and second segments.

12. The method of claim 9, wherein the loss segment and first and second segments comprise identical materials.

13. The method of claim 9, wherein the loss segment comprises a saturable absorber.

14. The method of claim 9, wherein imposing a modulation signal encoding the data on a loss segment of the distributed feedback gain section further comprises imposing a modulation signal effective to cause the distributed feedback section to emit the frequency modulated first signal.

15. The method of claim 9, wherein imposing a modulation signal encoding the data on a loss segment of the distributed feedback gain section further comprises imposing a modulation signal effective to cause the distributed feedback section to emit the frequency modulated first signal having a frequency modulation bandwidth of between twelve and twenty four GHz.

16. A method for transmitting data comprising:
   biasing first and second segments of a distributed feedback gain section above a lasing threshold of the distributed feedback gain section;
   imposing a modulation signal encoding data on an electro-absorption section embedded in the distributed feedback gain section between the first and second segments to generate a frequency modulated first signal; and
   at least partially transforming the first signal into a substantially amplitude modulated second signal by transmitting the first signal through an optical spectrum reshaper;
   wherein imposing a modulation signal encoding the data on a loss segment of the distributed feedback gain section further comprises imposing a modulation signal effective to cause the distributed feedback gain section to emit the frequency modulated first signal having a frequency modulation bandwidth of between twelve and twenty four GHz.

17. The method of claim 16, wherein the electro-absorption section comprises a material having a bandgap wavelength that is shorter than that of the gain section.

18. The method of claim 16, wherein the electro-absorption section is substantially shorter than the first and second segments.

19. The method of claim 16, wherein the electro-absorption section has a length less than six percent that of a combined length of the first and second segments.

* * * * *